United States Patent
Xu et al.

(10) Patent No.: US 11,533,128 B2
(45) Date of Patent: Dec. 20, 2022

(54) RATE-MATCHING SCHEME FOR CONTROL CHANNELS USING POLAR CODES

(71) Applicant: QUALCOMM Incorporated, San Diego, CA (US)

(72) Inventors: Changlong Xu, Beijing (CN); Chao Wei, Beijing (CN); Jing Jiang, San Diego, CA (US); Gaojin Wu, Beijing (CN); Hari Sankar, San Diego, CA (US); Jilei Hou, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 221 days.

(21) Appl. No.: 16/468,622

(22) PCT Filed: Jan. 8, 2018

(86) PCT No.: PCT/CN2018/071750
§ 371 (c)(1),
(2) Date: Jun. 11, 2019

(87) PCT Pub. No.: WO2018/127172
PCT Pub. Date: Jul. 12, 2018

(65) Prior Publication Data
US 2020/0083987 A1 Mar. 12, 2020

Related U.S. Application Data

(63) Continuation of application No. PCT/CN2017/070632, filed on Jan. 9, 2017.

(30) Foreign Application Priority Data

Jan. 9, 2017 (CN) ................ PCT/CN2017/070632

(51) Int. Cl.
*H04L 1/00* (2006.01)
*H03M 13/13* (2006.01)
(Continued)

(52) U.S. Cl.
CPC .......... *H04L 1/0069* (2013.01); *H03M 13/13* (2013.01); *H03M 13/6356* (2013.01); *H03M 13/6375* (2013.01); *H04L 1/0058* (2013.01)

(58) Field of Classification Search
None
See application file for complete search history.

(56) References Cited

U.S. PATENT DOCUMENTS 8,724,636 B2 * 5/2014 Chen ................. H04W 72/042
370/395.1
9,281,917 B2 * 3/2016 Rinne ..................... H04L 5/023
(Continued)

FOREIGN PATENT DOCUMENTS

CA 2972832 A1 7/2015
CN 102420617 A 4/2012
(Continued)

OTHER PUBLICATIONS

The IEEE 100 the Authoritative Dictionary of IEEE Standards Terms, Seventh Edition, pp. 170, 269, 683, 684, 699, 872. (Year: 2000).*
(Continued)

*Primary Examiner* — April Y Blair
*Assistant Examiner* — Dipakkumar B Gandhi
(74) *Attorney, Agent, or Firm* — Patterson & Sheridan, L.L.P.

(57) ABSTRACT

Certain aspects of the present disclosure generally relate to wireless communications and, more particularly, to methods and apparatus for rate-matching control channels using polar codes. An exemplary method generally includes encoding a stream of bits using a polar code, determining a size of a circular buffer for storing the encoded stream of bits based, at least in part, on a minimum supported code rate and a control information size, and performing rate-matching on
(Continued)

stored encoded stream of bits based, at least in part, on a mother code size, N, and a number of coded bits for transmission, E.

44 Claims, 13 Drawing Sheets

(51) Int. Cl.
*H03M 13/00* (2006.01)
*H04L 5/00* (2006.01)

(56) References Cited

U.S. PATENT DOCUMENTS

| | | | |
|---|---|---|---|
| 2004/0181618 A1* | 9/2004 | Dottling | H04L 27/3488 710/33 |
| 2009/0175389 A1 | 7/2009 | Huang et al. | |
| 2009/0307562 A1* | 12/2009 | Lee | H03M 13/1148 714/758 |
| 2014/0019820 A1* | 1/2014 | Vardy | H03M 13/13 714/752 |
| 2014/0169388 A1* | 6/2014 | Jeong | H04L 1/0061 370/474 |
| 2015/0077277 A1* | 3/2015 | Alhussien | H04L 1/0057 341/67 |
| 2015/0194987 A1* | 7/2015 | Li | H04L 1/0057 714/752 |
| 2016/0013810 A1* | 1/2016 | Gross | H03M 13/09 714/776 |
| 2016/0248547 A1 | 8/2016 | Shen et al. | |
| 2016/0294418 A1* | 10/2016 | Huang | H03M 13/13 |
| 2016/0381615 A1 | 12/2016 | Nagaraja et al. | |
| 2017/0331590 A1* | 11/2017 | Wu | H04L 1/1819 |
| 2019/0109672 A1* | 4/2019 | Kim | H04L 5/001 |
| 2019/0207710 A1* | 7/2019 | Ye | H03M 13/6306 |
| 2019/0312678 A1* | 10/2019 | Yokomakura | H04L 69/324 |

FOREIGN PATENT DOCUMENTS

| | | |
|---|---|---|
| CN | 103023618 A | 4/2013 |
| CN | 103037223 A | 4/2013 |
| CN | 105164956 A | 12/2015 |
| CN | 105850059 A | 8/2016 |
| CN | 105874736 A | 8/2016 |
| CN | 106027068 A | 10/2016 |
| EP | 3057255 A1 | 8/2016 |
| EP | 3113387 A1 | 1/2017 |
| EP | 3113398 A1 | 1/2017 |
| JP | 2020505820 A | 2/2020 |
| WO | 2006067972 A1 | 6/2006 |
| WO | 2015062107 A1 | 5/2015 |
| WO | 2015123855 A1 | 8/2015 |
| WO | WO-2016209553 A1 | 12/2016 |
| WO | 2018127041 A1 | 7/2018 |

OTHER PUBLICATIONS

Hassani et al., Universal polar codes, IEEE, Conference Paper, pp. 1451-1455 (Year: 2014).*
Huawei., et al., "Overview of Polar Codes," 3GPP Draft; R1-162161, 3rd Generation Partnership Project (3GPP), Mobile Competence Centre; 650, Route Des Lucioles Centre; 650, Route Des Lucioles; F-06921 Sophia-Antipolis Cedex; France, vol. RAN WG1, Apr. 11, 2016-Apr. 15, 2016, Apr. 2, 2016, XP051080007, 7 pages, Retrieved from the internet: URL: http://www.3gpp.org/ftp/tsg_ran/WG1_RL1/TSGR1_84b/Docs/[retrieved on Apr. 2, 2016].
Huawei., et al., "Polar Codes—Encoding and Decoding," 3GPP Draft; R1-164039, 3rd Generation Partnership Project (3GPP), Mobile Competence Centre; 650, Route Des Lucioles Centre; 650, Route Des Lucioles; F-06921 Sophia-Antipolis Cedex; France, vol. RAN WG1, May 23, 2016-May 27, 2016, Apr. 27, 2016, 7 pages.

International Search Report and Written Opinion—PCT/CN2017/070632—ISA/EPO—dated Oct. 11, 2017.
International Search Report and Written Opinion—PCT/CN2018/071750—ISA/EPO—dated Mar. 27, 2017.
"LTE; Evolved Universal Terrestrial Radio Access (E-UTRA); Multiplexing and channel coding (3GPP TS 36.212 version 13.3.0 Release 13)", ETSI Technical Specification, European Telecommunications Standards Institute (ETSI), 650, Route Des Lucioles, F-06921 Sophia-Antipolis, France, vol. 3GPP RAN, No. V13.3.0 Oct. 6, 2016 (Oct. 6, 2016), XP014280291, pp. 1-143, Retrieved from the Internet: URL:http://www.etsi.org/deliver/etsi_ts/136200_136299/136212/13.03.00_60/ts_136212v13030 0p.pdf [retrieved on Oct. 6, 2016], p. 21-p. 23.
Mediatek Qualcomm Samsung ZTE: "Way Forward on Rate-Matching for Polar Code", 3GPP Draft, 3GPP TSG RAN WG1 Meeting #90, R1715000 Way Forward on Rate Matching for Polar Coding Final, 3rd Generation Partnership Project (3GPP), Mobile Competence Centre, 650, Route Des Lucioles, F-06921, Sophia-Antipolis Cedex, vol. RAN WG1. No. Prague, Czech Republic, Aug. 21, 2017-Aug. 25, 2017 Aug. 26, 2017 (Aug. 26, 2017), XP051328793, 24 Pages, Retrieved from the Internet: URL:http://www.3gpp.org/ftp/tsg_ran/WG1_RL1/TSGR1_90/Docs/[retrieved on Aug. 26, 2017], p. 7.
Motorola: "Circular Buffer Rate Matching for HUGE and RED HOT", 3GPP Draft, 3GPP TSG GERAN #34, GP-070858 Circular Buffer RM (MOTOROLA) (Revised), 3rd Generation Partnership Project (3GPP), Mobile Competence Centre, 650, Route Des Lucioles, F-06921, Sophia-Antipolis Cedex, France, vol. TSG GERAN, No. Shenzhen, May 10, 2007, May 10, 2007 (May 10, 2007), XP050018254, pp. 1-8, [retrieved on May 10, 2007], p. 1-p. 5.
Nokia et al., "Polar Codes for Control Channels", 3GPP Draft, 3GPP TSG-RAN WG1 #86bis, R1-1609590 Polar Code for Control Channels Final, 3rd Generation Partnership Project (3GPP), Mobile Competence Centre, 650, Route Des Lucioles, F-06921, Sophia-Antipolis Cedex, France, vol. RAN WG1, No. Lisbon, Portugal, Oct. 10, 2016-Oct. 14, 2016 Sep. 30, 2016 (Sep. 30, 2016), XP051158781, 14 Pages, Retrieved from the Internet: URL:http://www.3gpp.org/ftp/tsg_ran/WG1_RL1/TSGR1_86b/Docs/ [retrieved on Sep. 30, 2016], pp. 3,4.
Qualcomm Incorporated: "A Comprehensive Rate-Matching Scheme for Polar Codes and Performance Evaluation", 3GPP Draft, 3GPP TSG-RAN WG1 #88b, R1-1705634, a Comprehensive Rate-Matching Scheme for Polar Codes and Performance Evaluation, 3rd Generation Partnership Project (3GPP), Mobile Competence Centre, 650, Route Des Lucioles, vol. RAN WG1, No. Spokane, USA, Apr. 3, 2017-Apr. 7, 2017, Apr. 2, 2017 (Apr. 2, 2017), XP051243756, 9 pages, Retrieved from the Internet: URL: http://www.3gpp.org/ftp/Meetings_3GPP_SYNC/RAN1/Docs/ [retrieved on Apr. 2, 2017], pp. 1,2,5, Sections 2-3, the Whole Document.
Samsung: "Design of Unified Rate-Matching for Polar Codes", 3GPP Draft, 3GPP TSG RAN WG1 NR Ad-Hoc#2, R1-1710750_Design of Unified Rate-Matching for Polar Codes_R1, 3rd Generation Partnership Project (3GPP), Mobile Competence Centre, 650, Route Des Lucioles, F-06921, Sophia-Antipolis Cede, vol. RAN WG1. No. Qingdao, P.R. China, Jun. 27, 2017-Jun. 30, 2017, Jun. 20, 2017 (Jun. 20, 2017), XP051305768, pp. 1-6, Retrieved from the Internet: URL:http://www.3gpp.org/ftp/tsg_ran/WG1_RL1/TSGR1_AH/NR_AH_1706/Docs/, http://www.3gpp.org/ftp/tsg_ran/WG1_RL1/TSGR1_AH/NR_AH_1706/Docs/, [retrieved on—Jun. 20, 2017], pp. 1,2, the Whole Document.
Samsung: "Performance of Short-Length Polar Codes", 3GPP Draft, 3GPP TSG RAN WG1 #86, R1-1609072 Performance of Short-Length Polar Codes, 3rd Generation Partnership Project (3GPP), Mobile Competence Centre, 650, Route Des Lucioles, F-06921, Sophia-Antipolis Cedex, France, vol. RAN WG1, No. Lisbon, Portugal, Oct. 10, 2016-Oct. 14, 2016 Oct. 9, 2016 (Oct. 9, 2016), XP051149123, pp. 1-13, Retrieved from the Internet: URL:http://www.3gpp.org/ftp/Meetings_3GPP_SYNC/RAN1/Docs/ [retrieved on Oct. 9, 2016] pp. 2,3.
Supplementary European Search Report—EP18736063—Search Authority—Munich—dated Jul. 16, 2020.
Taiwan Search Report—TW107100766—TIPO—dated Mar. 30, 2021.

(56) References Cited

OTHER PUBLICATIONS

Mediatek Inc: "Examination of NR Coding Candidates for Low-Rate Applications" [online], 3GPP Draft, 3GPP TSG RAN WG1 Meeting #86, R1-167871 Examination of NR Coding Candidates for Low-Rate Applications, 3rd Generation Partnership Project (3GPP), Mobile Competence Centre, 650, Route Des Lucioles, F-06921 Sophia-Antipolis Cedex, France, vol. RAN WG1, No. Gothenburg, Sweden, Aug. 22, 2016-Aug. 26, 2016, Aug. 28, 2016 (Aug. 28, 2016), XP051142643, 15 Pages.

Niu, K., et al., "Beyond Turbo Codes: Rate-Compatible Punctured Polar Codes" [online], Proc, 2013 IEEE International Conference on Communications (ICC), IEEE, Jun. 9, 2013 (Jun. 9, 2013), XP032522402, pp. 3423-3427, ISSN: 1550-3607, DOI:10.1109/ICC.2013.6655078 [retrieved on Nov. 4, 2013].

Nokia, et al., "Coding Performance for Short Block eMBB Data" [online], 3GPP Draft, 3GPP TSG-RAN WG1 #87, R1-1612276, Reno, U.S.A., Nov. 14-18, 2016, 14 Pages, Retrieved from the Internet URL: http://www.3gpp.org/ftp/tsg_ran/WG1_RL1/TSGR1_87/Docs/R1-1612276.zip.

\* cited by examiner $K$ = the number of information bits for transmission
$R_{min}$ = the minimum supported coding rate
$N_2$ = the minimum power 2 integer not less than $K/R_{min}$
$E$ = the number of coded bits for transmission
$N$ = the mother code size
$N$ is either $N_2$ or $N_2/2$ depending on $K/R_{min}$ and $E$ $K = 32$ information bits for transmission
$R_{min} = 1/6$ minimum supported coding rate
$N_2 = 256$ the minimum power 2 integer not less than $K/R_{min}$
$E = 136$ coded bits for transmission
$N_M = 256$
$N_1 = 128$
$N = 128$ mother code size $K = 48$ information bits for transmission
$R_{min} = 1/6$ minimum supported coding rate
$N_2 = 512$ the minimum power 2 integer not less than $K/R_{min}$
$E = 384$ coded bits for transmission
$N_M = 512$
$N_1 = 512$
$N = 512$ mother code size

RATE-MATCHING SCHEME FOR CONTROL CHANNELS USING POLAR CODES

This application is a national stage application under 35 U.S.C. 371 of PCT/CN2018/071750, filed Jan. 8, 2018, which claims priority to International Application No. PCT/CN2017/070632, filed Jan. 9, 2017, which are both assigned to the assignee of the present application and are expressly incorporated by reference in their entireties.

BACKGROUND

Field of the Disclosure

Certain aspects of the present disclosure generally relate to wireless communications and, more particularly, to methods and apparatus for rate-matching control channels using polar codes.

Description of Related Art

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth and transmit power). Examples of such multiple-access technologies include: Long Term Evolution (LTE) systems, code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

In some examples, a wireless multiple-access communication system may include a number of base stations, each simultaneously supporting communication for multiple communication devices, otherwise known as user equipments (UEs). In LTE or LTE-A networks, a set of one or more base stations may define an eNodeB (eNB). In other examples (e.g., in a next generation or 5G network), a wireless multiple access communication system may include a number of distributed units (DUs) (e.g., edge units (EUs), edge nodes (ENs), radio heads (RHs), smart radio heads (SRHs), transmission reception points (TRPs), etc.) in communication with a number of central units (CUs) (e.g., central nodes (CNs), access node controllers (ANCs), etc.), where a set of one or more distributed units, in communication with a central unit, may define an access node (e.g., a new radio base station (NR BS), a new radio node-B (NR NB), a network node, 5G NB, gNB, etc.). A base station or DU may communicate with a set of UEs on downlink channels (e.g., for transmissions from a base station or to a UE) and uplink channels (e.g., for transmissions from a UE to a base station or distributed unit).

These multiple access technologies have been adopted in various telecommunication standards to provide a common protocol that enables different wireless devices to communicate on a municipal, national, regional, and even global level. An example of an emerging telecommunication standard is new radio (NR), for example, 5G radio access. NR is a set of enhancements to the LIE mobile standard promulgated by Third Generation Partnership Project (3GPP). It is designed to better support mobile broadband Internet access by improving spectral efficiency, lowering costs, improving services, making use of new spectrum, and better integrating with other open standards using OFDMA with a cyclic prefix (CP) on the downlink (DL) and on the uplink (UL) as well as support beamforming, multiple-input multiple-output (MIMO) antenna technology, and carrier aggregation.

However, as the demand for mobile broadband access continues to increase, there exists a need for further improvements in NR technology. Preferably, these improvements should be applicable to other multi-access technologies and the telecommunication standards that employ these technologies.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved communications in a wireless network.

Certain aspects of the present disclosure provide a method for wireless communications in a network. The method generally includes encoding a stream of bits using a polar code; determining a size of a circular buffer for storing the encoded stream of bits based, at least in part, on a minimum supported code rate, $R_{min}$, and a number of information bits, K; and performing rate-matching on a stored encoded stream of bits based, at least in part, on a mother code size, N, and a number of coded bits for transmission, E. Other aspects are provided including apparatuses, systems, and processing systems for performing the aforementioned method as well as non-transitory computer-readable mediums comprising instructions for performing the aforementioned method.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
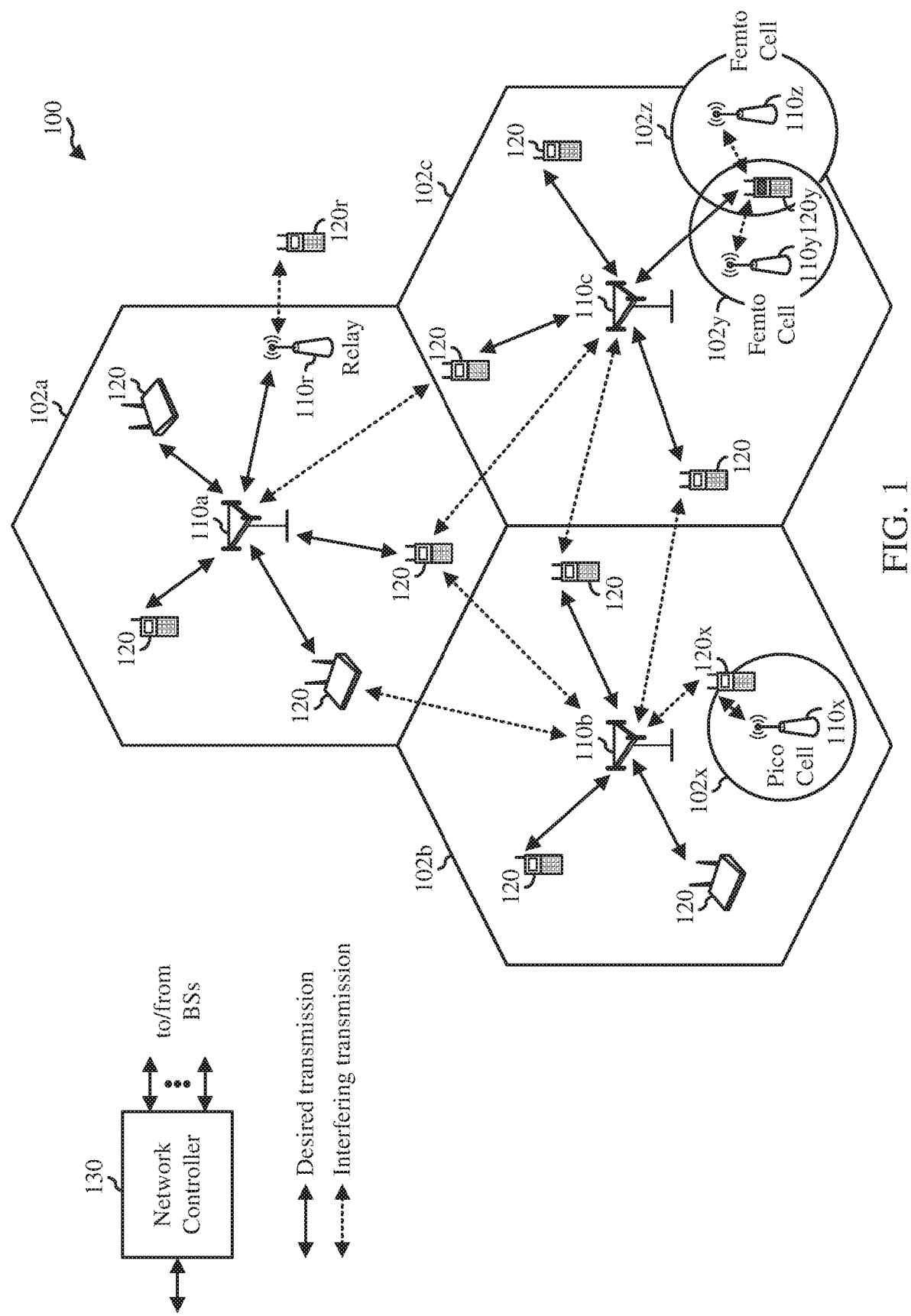
FIG. 1 is a block diagram conceptually illustrating an example telecommunications system, in accordance with certain aspects of the present disclosure.

Aspects of the present disclosure provide apparatus, methods, processing systems, and computer readable mediums for multi-slice networks, such as new radio (NR) (new radio access technology or 5G technology).

NR may support various wireless communication services, such as Enhanced mobile broadband (eMBB) targeting wide bandwidth (e.g. 80 MHz beyond), millimeter wave (mmW) targeting high carrier frequency (e.g. 60 GHz), massive machine-type communication (mMTC) targeting non-backward compatible machine-type communication (MTC) techniques, and/or mission critical targeting ultra-reliable low latency communications (URLLC). These services may include latency and reliability requirements. These services may also have different transmission time intervals (TTI) to meet respective quality of service (QoS) requirements. In addition, these services may co-exist in the same subframe.

Aspects of the present disclosure relate to a rate-matching scheme for control channels using polar codes. Rate matching is a process whereby the number of bits to be transmitted is matched to the available bandwidth, for example, the number of bits allowed to be transmitted. In certain instances the amount of data to be transmitted is less than the available bandwidth, and in such instances, all the data to be transmitted in addition to one or more copies of the data (a technique called repetition). In other instances the amount of data to be transmitted exceeds the available bandwidth, and in such instances a certain portion of the data to be transmitted may be omitted from the transmission (a technique called puncturing).

In NR, polar codes may be used to encode a stream of bits for transmission. However, in some cases, using a rate matching scheme may lead to performance loss when used with polar codes, for example, when the size of a circular buffer is not a power of 2 (e.g., the block length constraint of polar codes). Thus, aspects of the present disclosure propose an efficient rate-matching scheme for control channels using polar codes.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

The techniques described herein may be used for various wireless communication networks such as CDMA, TDMA, FDMA, OFDMA, SC-FDMA and other networks. The terms "network" and "system" are often used interchangeably. A CDMA network may implement a radio technology such as universal terrestrial radio access (UTRA), CDMA2000, etc. UTRA includes wideband CDMA (WCDMA), time division synchronous CDMA (TD-SCDMA), and other variants of CDMA. CDMA2000 covers IS-2000, IS-95 and IS-856 standards. A TDMA network may implement a radio technology such as global system for mobile communications (GSM). An OFDMA network may implement a radio technology such as evolved UTRA (E-UTRA), ultra-mobile broadband (UMB), IEEE 802.11 (Wi-Fi), IEEE 802.16 (WiMAX), IEEE 802.20, Flash-OFDM®, etc. UTRA and E-UTRA are part of universal mobile telecommunication system (UMTS). 3GPP Long Term Evolution (LTE) and LTE-Advanced (LTE-A), in both frequency division duplex (FDD) and time division duplex (TDD), are new releases of UNITS that use E-UTRA, which employs OFDMA on the downlink and SC-FDMA on the uplink. UTRA, E-UTRA, UNITS, LTE, LTE-A and GSM are described in documents from an organization named "3rd Generation Partnership Project" (3GPP). CDMA2000 and UMB are described in documents from an organization named "3rd Generation Partnership Project 2" (3GPP2). The techniques described herein may be used for the wireless networks and radio technologies mentioned above as well as other wireless networks and radio technologies, such as a 5G nextgen/NR network.

Example Wireless Communications System

FIG. 1 illustrates an example wireless network 100, such as a new radio (NR) or 5G network, in which aspects of the present disclosure may be performed, for example, for rate-matching control channels using polar codes.

As illustrated in FIG. 1, the wireless network 100 may include a number of base stations (BSs) 110 and other network entities. A BS may be a station that communicates with user equipments (UEs). Each BS 110 may provide communication coverage for a particular geographic area. In 3GPP, the term "cell" can refer to a coverage area of a Node B and/or a Node B subsystem serving this coverage area, depending on the context in which the term is used. In NR systems, the term "cell" and eNB, Node B, 5G NB, AP, NR BS, BS, or TRP may be interchangeable. In some examples, a cell may not necessarily be stationary, and the geographic area of the cell may move according to the location of a mobile base station. In some examples, the base stations may be interconnected to one another and/or to one or more other base stations or network nodes (not shown) in the wireless network 100 through various types of backhaul interfaces such as a direct physical connection, a virtual network, or the like using any suitable transport network.

In general, any number of wireless networks may be deployed in a given geographic area. Each wireless network may support a particular radio access technology (RAT) and may operate on one or more frequencies. A RAT may also be referred to as a radio technology, an air interface, etc. A frequency may also be referred to as a carrier, a frequency channel, etc. Each frequency may support a single RAT in a given geographic area in order to avoid interference between wireless networks of different RATS.

A BS may provide communication coverage for a macro cell, a pico cell, a femto cell, and/or other types of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a Closed Subscriber Group (CSG), UEs for users in the home, etc.). A BS for a macro cell may be referred to as a macro BS. A BS for a pico cell may be referred to as a pico BS. A BS for a femto cell may be referred to as a femto BS or a home BS.

In the example shown in FIG. 1, the BSs 110a, 110b and 110c may be macro BSs for the macro cells 102a, 102b and 102c, respectively. The BS 110x may be a pico BS for a pico cell 102x. The BSs 110y and 110z may be femto BS for the femto cells 102y and 102z, respectively. A BS may support one or multiple (e.g., three) cells.

The wireless network 100 may also include relay stations. A relay station is a station that receives a transmission of data and/or other information from an upstream station (e.g., a BS or a UE) and sends a transmission of the data and/or other information to a downstream station (e.g., a UE or a BS). A relay station may also be a UE that relays transmissions for other UEs. In the example shown in FIG. 1, a relay station 110r may communicate with the BS 110a and a UE 120r in order to facilitate communication between the BS 110a and the UE 120r. A relay station may also be referred to as a relay BS, a relay, etc.

The wireless network 100 may be a heterogeneous network that includes BSs of different types, e.g., macro BS, pico BS, femto BS, relays, etc. These different types of BSs may have different transmit power levels, different coverage areas, and different impact on interference in the wireless network 100. For example, macro BS may have a high transmit power level (e.g., 20 Watts) whereas pico BS, femto BS, and relays may have a lower transmit power level (e.g., 1 Watt).

The wireless network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time. The techniques described herein may be used for both synchronous and asynchronous operation.

A network controller 130 may couple to a set of BSs and provide coordination and control for these BSs. The network controller 130 may communicate with the BSs 110 via a backhaul. The BSs 110 may also communicate with one another, e.g., directly or indirectly via wireless or wireline backhaul.

The UEs 120 (e.g., 120x, 120y, etc.) may be dispersed throughout the wireless network 100, and each UE may be stationary or mobile. A UE may also be referred to as a mobile station, a terminal, an access terminal, a subscriber unit, a station, a Customer Premises Equipment (CPE), a cellular phone, a smart phone, a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or medical equipment, a biometric sensor/device, a wearable device such as a smart watch, smart clothing, smart glasses, a smart wrist band, smart jewelry (e.g., a smart ring, a smart bracelet, etc.), an entertainment device (e.g., a music device, a video device, a satellite radio, etc.), a vehicular component or sensor, a smart meter/sensor, industrial manufacturing equipment, a global positioning system device, or any other suitable device that is configured to communicate via a wireless or wired medium. Some UEs may be considered evolved or machine-type communication (MTC) devices or evolved MTC (eMTC) devices. MTC and eMTC UEs include, for example, robots, drones, remote devices, sensors, meters, monitors, location tags, etc., that may communicate with a BS, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices.

In FIG. 1, a solid line with double arrows indicates desired transmissions between a UE and a serving BS, which is a BS designated to serve the UE on the downlink and/or uplink. A dashed line with double arrows indicates interfering transmissions between a UE and a BS.

Certain wireless networks (e.g., LTE) utilize orthogonal frequency division multiplexing (OFDM) on the downlink and single-carrier frequency division multiplexing (SC-FDM) on the uplink. OFDM and SC-FDM partition the system bandwidth into multiple orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers may be dependent on the system bandwidth. For example, the spacing of the subcarriers may be 15 kHz and the minimum resource allocation (called a 'resource block') may be 12 subcarriers (or 180 kHz). Consequently, the nominal ITT size may be equal to 128, 256, 512, 1024 or 2048 for system bandwidth of 1.25, 2.5, 5, 10 or 20 megahertz (MHz), respectively. The system bandwidth may also be partitioned into subbands. For example, a subband may cover 1.08 MHz (i.e., 6 resource blocks), and there may be 1, 2, 4, 8 or 16 subbands for system bandwidth of 1.25, 2.5, 5, 10 or 20 MHz, respectively.

While aspects of the examples described herein may be associated with LIE technologies, aspects of the present disclosure may be applicable with other wireless communications systems, such as NR/5G.

NR may utilize OFDM with a cyclic prefix (CP) on the uplink and downlink and include support for half-duplex operation using TDD. A single component carrier bandwidth of 100 MHz, may be supported. NR resource blocks may span 12 sub-carriers with a sub-carrier bandwidth of 75 kHz over a 0.1 ms duration. Each radio frame may consist of 50 subframes with a length of 10 ms. Consequently, each subframe may have a length of 0.2 ms. Each subframe may indicate a link direction (i.e., downlink (DL) or uplink (UL)) for data transmission and the link direction for each subframe may be dynamically switched. Each subframe may include DL/UL data as well as DL/UL control data. UL and DL subframes for NR may be as described in more detail below with respect to FIGS. 9 and 10. Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells. Alternatively, NR may support a different air interface, other than an OFDM-based. NR networks may include entities such CUs and/or DUs.

In some examples, access to the air interface may be scheduled, wherein a scheduling entity (e.g., a base station) allocates resources for communication among some or all devices and equipment within its service area or cell. Within the present disclosure, as discussed further below, the scheduling entity may be responsible for scheduling, assigning, reconfiguring, and releasing resources for one or more subordinate entities. That is, for scheduled communication, subordinate entities utilize resources allocated by the scheduling entity. Base stations are not the only entities that may function as a scheduling entity. That is, in some examples, a UE may function as a scheduling entity, scheduling resources for one or more subordinate entities (e.g., one or more other UEs). In this example, the UE is functioning as a scheduling entity, and other UEs utilize resources scheduled by the UE for wireless communication. A UE may function as a scheduling entity in a peer-to-peer (P2P) network, and/or in a mesh network. In a mesh network example, UEs may optionally communicate directly with one another in addition to communicating with the scheduling entity.

Thus, in a wireless communication network with a scheduled access to time-frequency resources and having a cellular configuration, a P2P configuration, and a mesh configuration, a scheduling entity and one or more subordinate entities may communicate utilizing the scheduled resources.

As noted above, a RAN may include a CU and DUs. A NR BS (e.g., gNB, 5G Node B, Node B, transmission reception point (TRP), access point (AP)) may correspond to one or multiple BSs. NR cells can be configured as access cell (ACells) or data only cells (DCells). For example, the RAN (e.g., a central unit or distributed unit) can configure the cells. DCells may be cells used for carrier aggregation or dual connectivity, but not used for initial access, cell selection/reselection, or handover. In some cases DCells may not transmit synchronization signals (SS)—in some case cases DCells may transmit SS. NR BSs may transmit downlink signals to UEs indicating the cell type. Based on the cell type indication, the UE may communicate with the NR BS. For example, the UE may determine NR BSs to consider for cell selection, access, handover, and/or measurement based on the indicated cell type.

Figure 2:
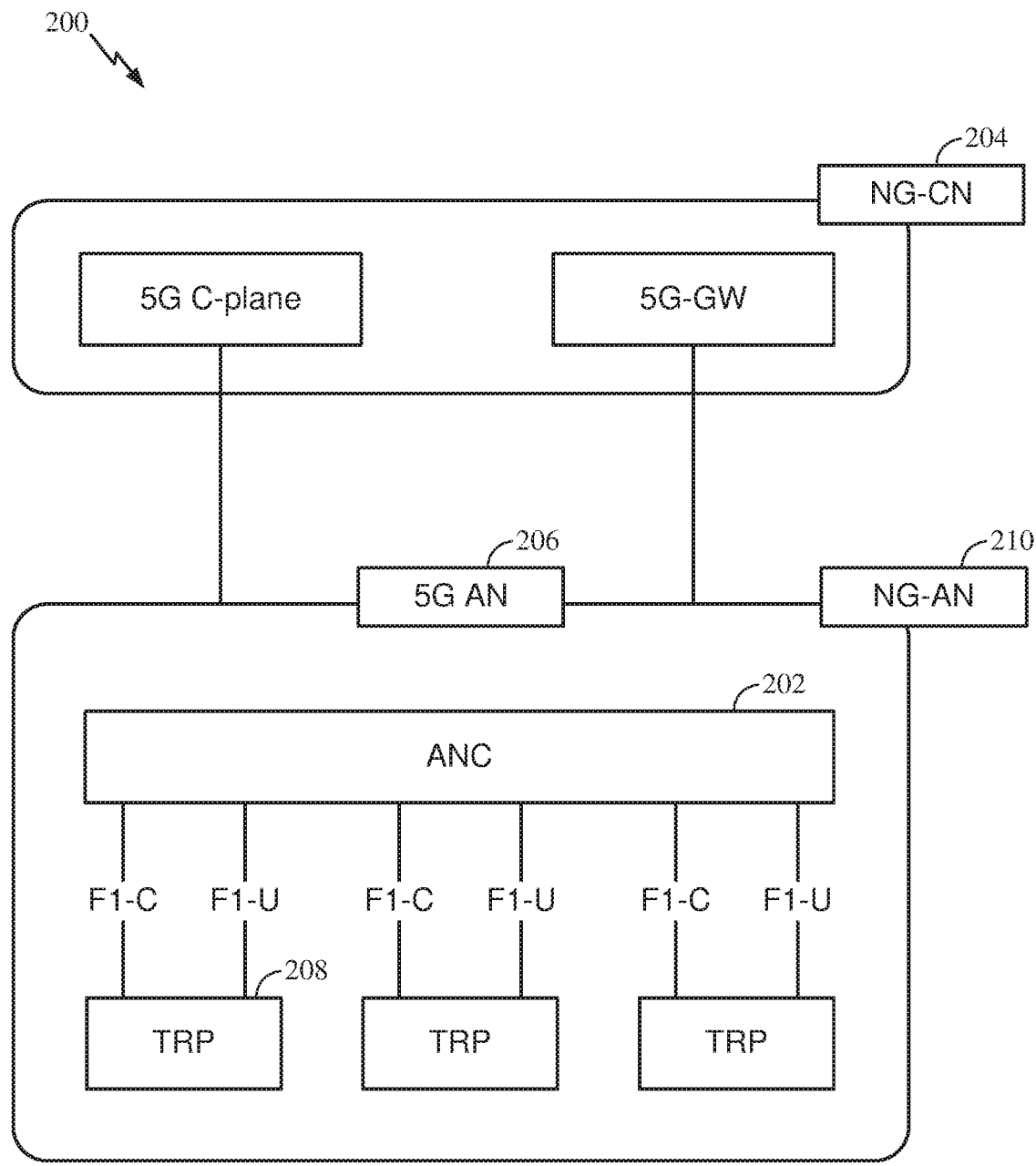
FIG. 2 is a block diagram illustrating an example logical architecture of a distributed Radio Access Network (RAN), in accordance with certain aspects of the present disclosure.

FIG. 2 illustrates an example logical architecture of a distributed radio access network (RAN) 200, which may be implemented in the wireless communication system illustrated in FIG. 1. A 5G access node 206 may include an access node controller (ANC) 202. The ANC may be a central unit (CU) of the distributed RAN 200. The backhaul interface to the next generation core network (NG-CN) 204 may terminate at the ANC. The backhaul interface to neighboring next generation access nodes (NG-ANs) may terminate at the ANC. The ANC may include one or more TRPs 208 (which may also be referred to as BSs, NR BSs, Node Bs, 5G NBs, APs, or some other term). As described above, a TRP may be used interchangeably with "cell."

The TRPs 208 may be a DU. The TRPs may be connected to one ANC (ANC 202) or more than one ANC (not illustrated). For example, for RAN sharing, radio as a service (RaaS), and service specific AND deployments, the TRP may be connected to more than one ANC. A TRP may include one or more antenna ports. The TRPs may be configured to individually (e.g., dynamic selection) or jointly (e.g., joint transmission) serve traffic to a UE.

The local architecture 200 may be used to illustrate fronthaul definition. The architecture may be defined that support fronthauling solutions across different deployment types. For example, the architecture may be based on transmit network capabilities (e.g., bandwidth, latency, and/or jitter).

The architecture may share features and/or components with LTE. According to aspects, the next generation AN (NG-AN) 210 may support dual connectivity with NR. The NG-AN may share a common fronthaul for LTE and NR.

The architecture may enable cooperation between and among TRPs 208. For example, cooperation may be preset within a TRP and/or across TRPs via the ANC 202. According to aspects, no inter-TRP interface may be needed/present.

According to aspects, a dynamic configuration of split logical functions may be present within the architecture 200. As will be described in more detail with reference to FIG. 5, the Radio Resource Control (RRC) layer, Packet Data Convergence Protocol (PDCP) layer, Radio Link Control (RLC) layer, Medium Access Control (MAC) layer, and a Physical (PHY) layers may be adaptably placed at the DU or CU (e.g., TRP or ANC, respectively). According to certain aspects, a BS may include a central unit (CU) (e.g., ANC 202) and/or one or more distributed units (e.g., one or more TRPS 208).

Figure 3:
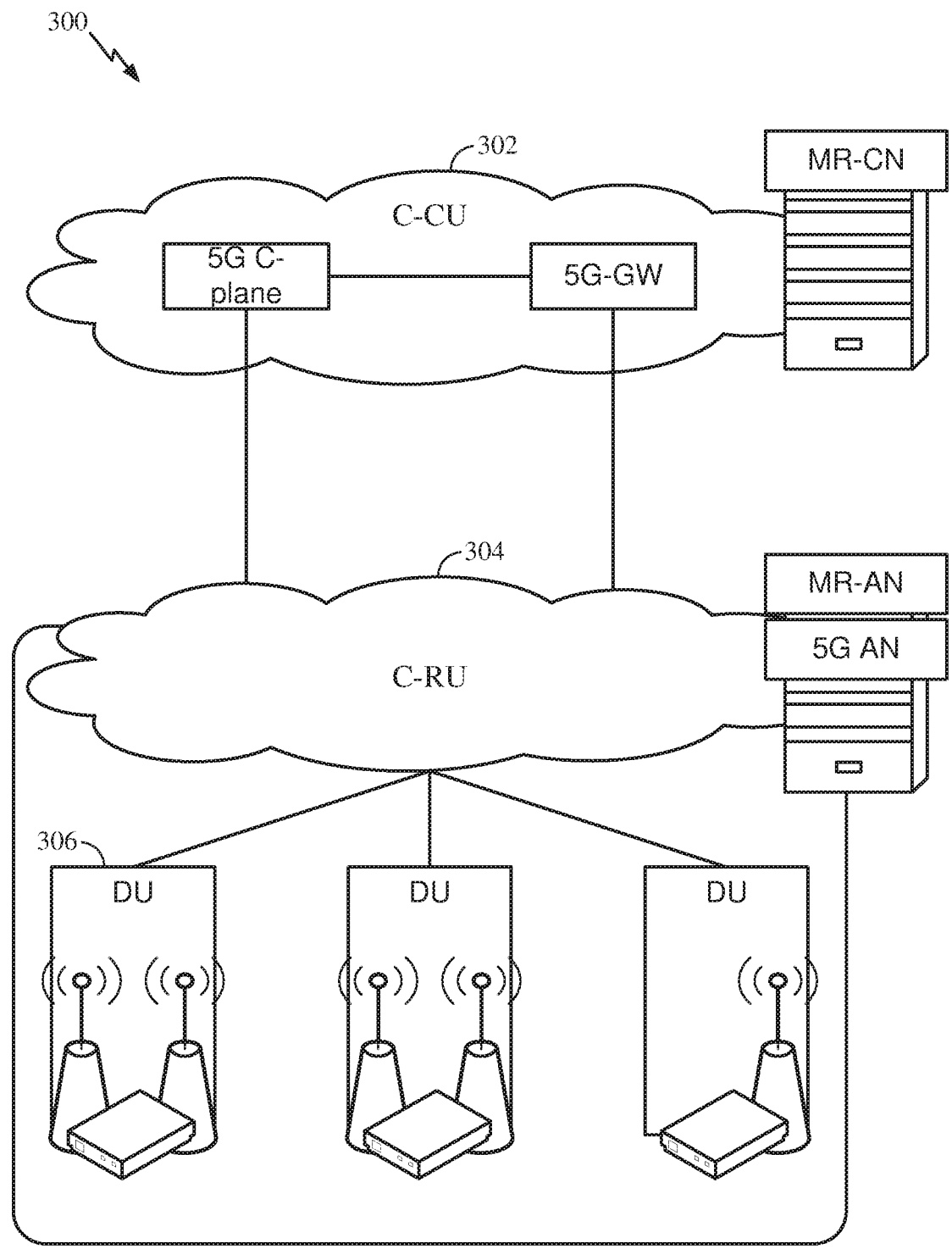
FIG. 3 is a diagram illustrating an example physical architecture of a distributed RAN, in accordance with certain aspects of the present disclosure.

FIG. 3 illustrates an example physical architecture of a distributed RAN 300, according to aspects of the present disclosure. A centralized core network unit (C-CU) 302 may host core network functions. The C-CU may be centrally deployed. C-CU functionality may be offloaded (e.g., to advanced wireless services (AWS)), in an effort to handle peak capacity.

A centralized RAN unit (C-RU) 304 may host one or more ANC functions. Optionally, the C-RU may host core network functions locally. The C-RU may have distributed deployment. The C-RU may be closer to the network edge.

A DU 306 may host one or more TRPs (edge node (EN), an edge unit (EU), a radio head (RH), a smart radio head (SRH), or the like). The DU may be located at edges of the network with radio frequency (RF) functionality.

Figure 4:
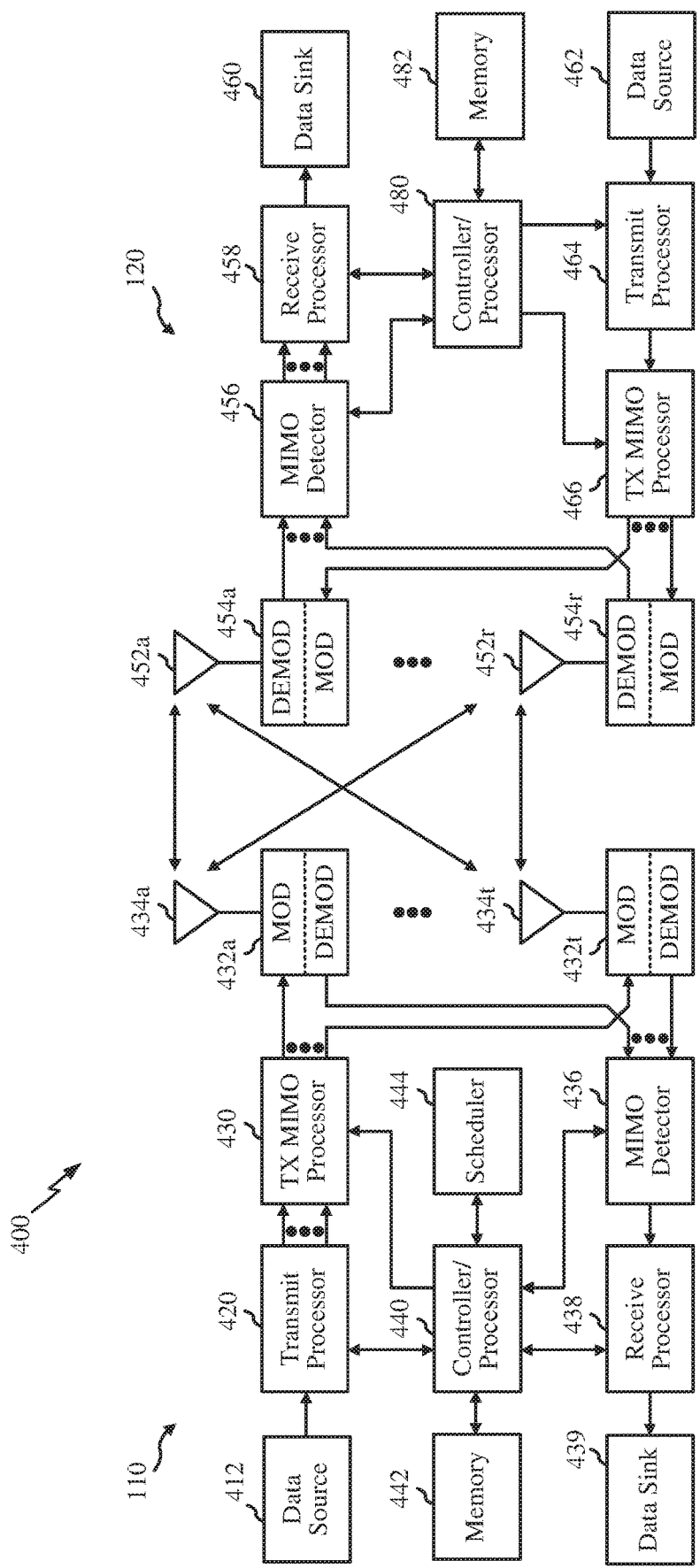
FIG. 4 is a block diagram conceptually illustrating a design of an example Base Station (BS) and user equipment (UE), in accordance with certain aspects of the present disclosure.

FIG. 4 illustrates example components of the BS 110 and UE 120 illustrated in FIG. 1, which may be used to implement aspects of the present disclosure. As described above, the BS may include a TRP. One or more components of the BS 110 and UE 120 may be used to practice aspects of the present disclosure. For example, antennas 452, TX/RX 454a, processors 466, 458, 464, and/or controller/processor 480 of the UE 120 and/or antennas 434, processors 430, 420, 438, and/or controller/processor 440 of the BS 110 may be used to perform the operations described herein and illustrated with reference to FIGS. 11-15.

According to aspects, for a restricted association scenario, the base station 110 may be the macro BS 110c in FIG. 1, and the UE 120 may be the UE 120y. The base station 110 may also be a base station of some other type. The base station 110 may be equipped with antennas 434a through 434t, and the UE 120 may be equipped with antennas 452a through 452r.

At the base station 110, a transmit processor 420 may receive data from a data source 412 and control information from a controller/processor 440. The control information may be for the Physical Broadcast Channel (PBCH), Physical Control Format Indicator Channel (PCFICH), Physical Hybrid ARQ Indicator Channel (PHICH), Physical Downlink Control Channel (PDCCH), etc. The data may be for the Physical Downlink Shared Channel (PDSCH), etc. The processor 420 may process (e.g., encode and symbol map) the data and control information to obtain data symbols and control symbols, respectively. The processor 420 may also generate reference symbols, e.g., for the PSS, SSS, and cell-specific reference signal. A transmit (TX) multiple-input multiple-output (MIMO) processor 430 may perform spatial processing (e.g., precoding) on the data symbols, the control symbols, and/or the reference symbols, if applicable, and may provide output symbol streams to the modulators (MODS) 432a through 432t. Each modulator 432 may process a respective output symbol stream (e.g., for OFDM, etc.) to obtain an output sample stream. Each modulator 432 may further process (e.g., convert to analog, amplify, filter, and upconvert) the output sample stream to obtain a downlink signal. Downlink signals from modulators 432a through 432t may be transmitted via the antennas 434a through 434t, respectively.

At the UE 120, the antennas 452a through 452r may receive the downlink signals from the base station 110 and may provide received signals to the demodulators (DEMODs) 454a through 454r, respectively. Each demodulator 454 may condition (e.g., filter, amplify, downconvert, and digitize) a respective received signal to obtain input samples. Each demodulator 454 may further process the input samples (e.g., for OFDM, etc.) to obtain received symbols. A MIMO detector 456 may obtain received symbols from all the demodulators 454a through 454r, perform MIMO detection on the received symbols if applicable, and provide detected symbols. A receive processor 458 may process (e.g., demodulate, deinterleave, and decode) the detected symbols, provide decoded data for the UE 120 to a data sink 460, and provide decoded control information to a controller/processor 480.

On the uplink, at the UE 120, a transmit processor 464 may receive and process data (e.g., for the Physical Uplink Shared Channel (PUSCH)) from a data source 462 and control information (e.g., for the Physical Uplink Control Channel (PUCCH) from the controller/processor 480. The transmit processor 464 may also generate reference symbols for a reference signal. The symbols from the transmit processor 464 may be precoded by a TX MIMO processor 466 if applicable, further processed by the demodulators 454a through 454r (e.g., for SC-FDM, etc.), and transmitted to the base station 110. At the BS 110, the uplink signals from the UE 120 may be received by the antennas 434a through 434t, processed by the modulators 432a through 432t, detected by a MIMO detector 436 if applicable, and further processed by a receive processor 438 to obtain decoded data and control information sent by the UE 120. The receive processor 438 may provide the decoded data to a data sink 439 and the decoded control information to the controller/processor 440.

The controllers/processors 440 and 480 may direct the operation at the base station 110 and the UE 120, respectively. The processor 440 and/or other processors and modules at the base station 110 may perform or direct, e.g., the execution of the functional blocks illustrated in FIG. 6, and/or other processes for the techniques described herein. The processor 480 and/or other processors and modules at the UE 120 may also perform or direct, e.g., the execution of the functional blocks illustrated in FIGS. 7 and 8, and/or other processes for the techniques described herein. The memories 442 and 482 may store data and program codes for the BS 110 and the UE 120, respectively. A scheduler 444 may schedule UEs for data transmission on the downlink and/or uplink.

Figure 5:
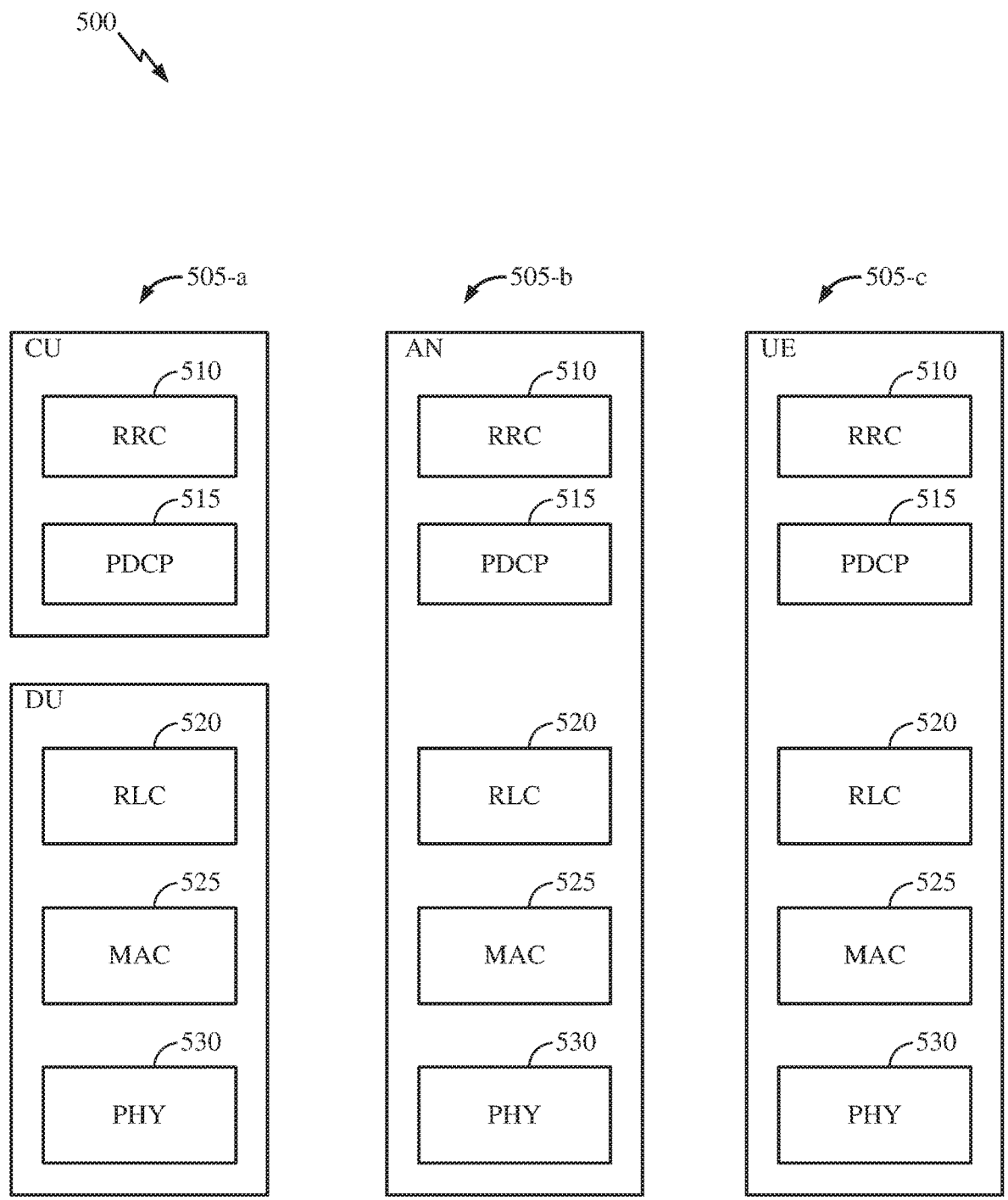
FIG. 5 is a diagram showing examples for implementing a communication protocol stack, in accordance with certain aspects of the present disclosure.

FIG. 5 illustrates a diagram 500 showing examples for implementing a communications protocol stack, according to aspects of the present disclosure. The illustrated communications protocol stacks may be implemented by devices operating in a 5G system (e.g., a system that supports uplink-based mobility). Diagram 500 illustrates a communications protocol stack including a Radio Resource Control (RRC) layer 510, a Packet Data Convergence Protocol (PDCP) layer 515, a Radio Link Control (RLC) layer 520, a Medium Access Control (MAC) layer 525, and a Physical (PHY) layer 530. In various examples the layers of a protocol stack may be implemented as separate modules of software, portions of a processor or ASIC, portions of non-collocated devices connected by a communications link, or various combinations thereof. Collocated and non-collocated implementations may be used, for example, in a protocol stack for a network access device (e.g., ANs, CUs, and/or DUs) or a UE.

A first option 505-*a* shows a split implementation of a protocol stack, in which implementation of the protocol stack is split between a centralized network access device (e.g., an ANC 202 in FIG. 2) and distributed network access device (e.g., DU 208 in FIG. 2). In the first option 505-*a*, an RRC layer 510 and a PDCP layer 515 may be implemented by the central unit, and an RLC layer 520, a MAC layer 525, and a PHY layer 530 may be implemented by the DU. In various examples the CU and the DU may be collocated or non-collocated. The first option 505-*a* may be useful in a macro cell, micro cell, or pica cell deployment.

A second option 505-*b* shows a unified implementation of a protocol stack, in which the protocol stack is implemented in a single network access device (e.g., access node (AN), new radio base station (NR BS), a new radio Node-B (NR NB), a network node (NN), or the like.). In the second option, the RRC layer 510, the PDCP layer 515, the RLC layer 520, the MAC layer 525, and the PHY layer 530 may each be implemented by the AN. The second option 505-*b* may be useful in a femto cell deployment.

Regardless of whether a network access device implements part or all of a protocol stack, a UE may implement an entire protocol stack 505-*c* (e.g., the RRC layer 510, the PDCP layer 515, the RLC layer 520, the MAC layer 525, and the PHY layer 530).

Figure 6:
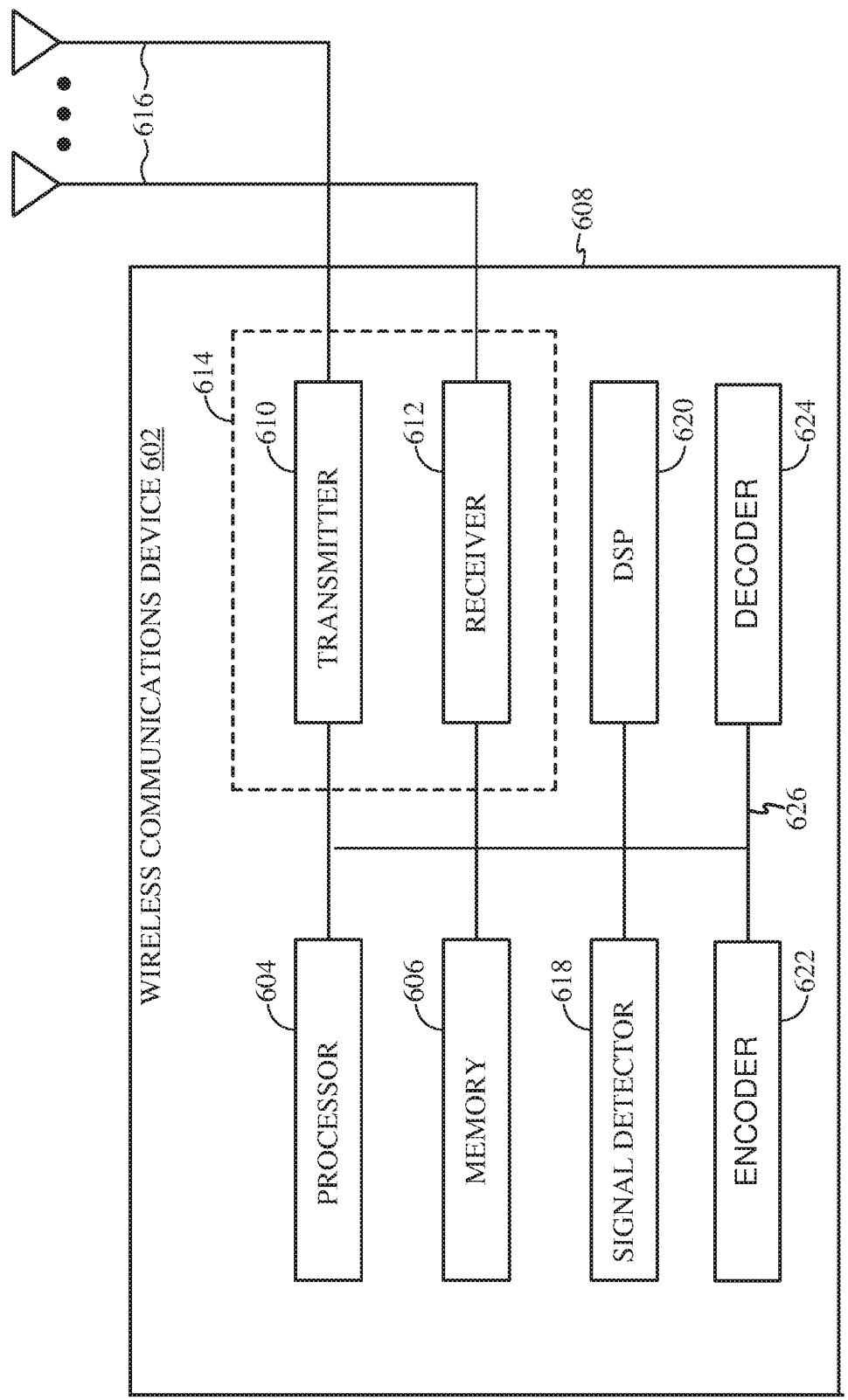
FIG. 6 illustrates a block diagram of an example wireless device in accordance with certain aspects of the present disclosure.

FIG. 6 illustrates various components that may be utilized in a wireless communications device 602 that may be employed within the wireless communication system from FIG. 1. The wireless communications device 602 is an example of a device that may be configured to implement the various methods described herein. The wireless communications device 602 may be a BS 110 from FIG. 1 or any of user equipments 120.

The wireless communications device 602 may include a processor 604 that controls operation of the wireless communications device 602. The processor 604 may also be referred to as a central processing unit (CPU). Memory 606, which may include both read-only memory (ROM) and random access memory (RAM), provides instructions and data to the processor 604. A portion of the memory 606 may also include non-volatile random access memory (NVRAM). The processor 604 typically performs logical and arithmetic operations based on program instructions stored within the memory 606. The instructions in the memory 606 may be executable to implement the methods described herein.

The wireless communications device 602 may also include a housing 608 that may include a transmitter 610 and a receiver 612 to allow transmission and reception of data between the wireless device 602 and a remote location. The transmitter 610 and receiver 612 may be combined into a transceiver 614. A single or a plurality of transmit antennas 616 may be attached to the housing 608 and electrically coupled to the transceiver 614. The wireless communications device 602 may also include (not shown) multiple transmitters, multiple receivers, and multiple transceivers.

The wireless communications device 602 may also include a signal detector 618 that may be used in an effort to detect and quantify the level of signals received by the transceiver 614. The signal detector 618 may detect such signals as total energy, energy per subcarrier per symbol, power spectral density and other signals. The wireless communications device 602 may also include a digital signal processor (DSP) 620 for use in processing signals.

Additionally, the wireless communications device 602 may also include an encoder 622 for use in encoding signals for transmission. The encoder may also store the encoded signals in a circular buffer (not shown) and perform rate matching on the encoded signals (e.g., by implementing operations 1200). Further, the wireless communication device 602 may include a decoder 624 for use in decoding received signals.

The various components of the wireless communications device 602 may be coupled together by a bus system 626, which may include a power bus, a control signal bus, and a status signal bus in addition to a data bus. The processor 604 may be configured to access instructions stored in the memory 606 to perform connectionless access, in accordance with aspects of the present disclosure discussed below.

Figure 7:
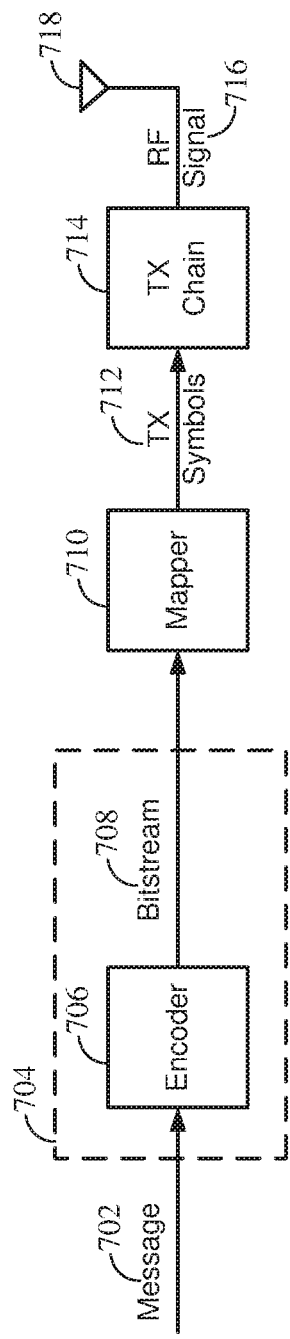
FIG. 7 is a simplified block diagram illustrating an encoder, in accordance with certain aspects of the present disclosure.

FIG. 7 is a simplified block diagram illustrating an encoder, in accordance with certain aspects of the present disclosure. FIG. 7 illustrates a portion of a radio frequency (RF) modem 704 that may be configured to provide an encoded message for wireless transmission (e.g., using polar codes described below). In one example, an encoder 706 in a base station (e.g., BS 110) or in a UE (e.g., UE 120) receives a message 702 for transmission. The message 702 may contain data and/or encoded voice or other content directed to the receiving device. The encoder 706 encodes the message using a suitable modulation and coding scheme (MCS), typically selected based on a configuration defined by a base station (e.g., BS 110) or another network entity. The encoded bitstream 708 may then be stored in circular buffer and rate-matching may be performed on the stored encoded bitstream, for example, according to aspects presented below. After the encoded bitstream 708 is rate-matched, the encoded bitstream 708 may then be provided to a mapper 710 that generates a sequence of TX symbols 712 that are modulated, amplified and otherwise processed by TX chain 714 to produce an RF signal 716 for transmission through antenna 718.

Figure 8:
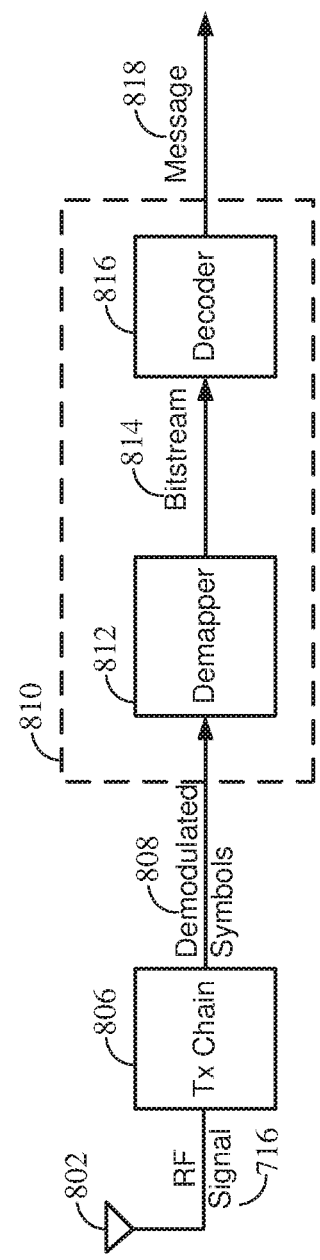
FIG. 8 is a simplified block diagram illustrating a decoder, in accordance with certain aspects of the present disclosure.

FIG. 8 is a simplified block diagram illustrating a decoder, in accordance with certain aspects of the present disclosure. FIG. 8 illustrates a portion of a RF modem 810 that may be configured to receive and decode a wirelessly transmitted signal including an encoded message (e.g., a message encoded using a polar code as described below). In various examples, the modem 810 receiving the signal may reside at the access terminal, at the base station, or at any other suitable apparatus or means for carrying out the described functions. An antenna 802 provides an RF signal 716 (i.e., the RF signal produced in FIG. 7) to an access terminal (e.g., UE 120). An RF chain 806 processes and demodulates the RF signal 716 and may provide a sequence of symbols 808 to a demapper 812, which produces a bitstream 814 representative of the encoded message.

A decoder 816 may then be used to decode M-bit information strings from a bitstream that has been encoded using a coding scheme (e.g., a Polar code). The decoder 816 may comprise a Viterbi decoder, an algebraic decoder, a butterfly decoder, or another suitable decoder. In one example, a Viterbi decoder employs the well-known Viterbi algorithm to find the most likely sequence of signaling states (the Viterbi path) that corresponds to a received bitstream 814. The bitstream 814 may be decoded based on a statistical analysis of Log-Likelihood Ratios (LLRs) calculated for the bitstream 814. In one example, a Viterbi decoder may compare and select the correct Viterbi path that defines a sequence of signaling states using a likelihood ratio test to generate LLRs from the bitstream 814. Likelihood ratios can be used to statistically compare the fit of a plurality of candidate Viterbi paths using a likelihood ratio test that compares the logarithm of a likelihood ratio for each candidate Viterbi path (i.e. the LLR) to determine which path is more likely to account for the sequence of symbols that produced the bitstream 814. The decoder 816 may then decode the bitstream 814 based on the LLRs to determine the message 818 containing data and/or encoded voice or other content transmitted from the base station (e.g., BS 110).

Figure 9:
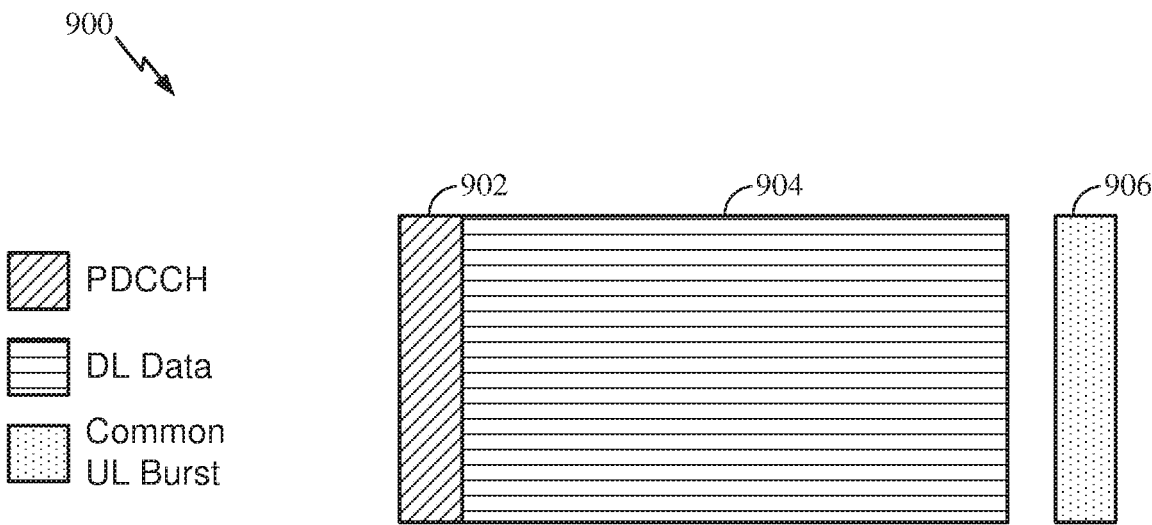
FIG. 9 illustrates an example of a downlink-centric subframe, in accordance with certain aspects of the present disclosure.

FIG. 9 is a diagram 900 showing an example of a downlink-centric subframe, which may be used by one or more devices (e.g., BS 110 and/or UE 120) to communicate in the wireless network 100 depicted in FIG. 1. The DL-centric subframe may include a control portion 902. The control portion 902 may exist in the initial or beginning portion of the DL-centric subframe. The control portion 902 may include various scheduling information and/or control information corresponding to various portions of the DL-centric subframe. In some configurations, the control portion 902 may be a physical DL control channel (PDCCH), as indicated in FIG. 9. The DL-centric subframe may also include a DL data portion 904. The DL data portion 904 may sometimes be referred to as the payload of the DL-centric subframe. The DL data portion 904 may include the communication resources utilized to communicate DL data from the scheduling entity (e.g., UE or BS) to the subordinate entity (e.g., UE). In some configurations, the DL data portion 904 may be a physical DL shared channel (PDSCH).

The DL-centric subframe may also include a common uplink (UL) portion 906. The common UL portion 906 may sometimes be referred to as an UL burst, a common UL burst, and/or various other suitable terms. The common UL portion 906 may include feedback information corresponding to various other portions of the DL-centric subframe. For example, the common UL portion 906 may include feedback information corresponding to the control portion 902. Non-limiting examples of feedback information may include an ACK signal, a NACK signal, a HARQ indicator, and/or various other suitable types of information. The common UL portion 906 may include additional or alternative information, such as information pertaining to random access channel (RACH) procedures, scheduling requests (SRs), and various other suitable types of information. As illustrated in FIG. 9, the end of the DL data portion 904 may be separated in time from the beginning of the common UL portion 906. This time separation may sometimes be referred to as a gap, a guard period, a guard interval, and/or various other suitable terms. This separation provides time for the switch-over from DL communication (e.g., reception operation by the subordinate entity (e.g., UE)) to UL communication (e.g., transmission by the subordinate entity (e.g., UE)). The foregoing is merely one example of a DL-centric subframe and alternative structures having similar features may exist without necessarily deviating from the aspects described herein.

Figure 10:
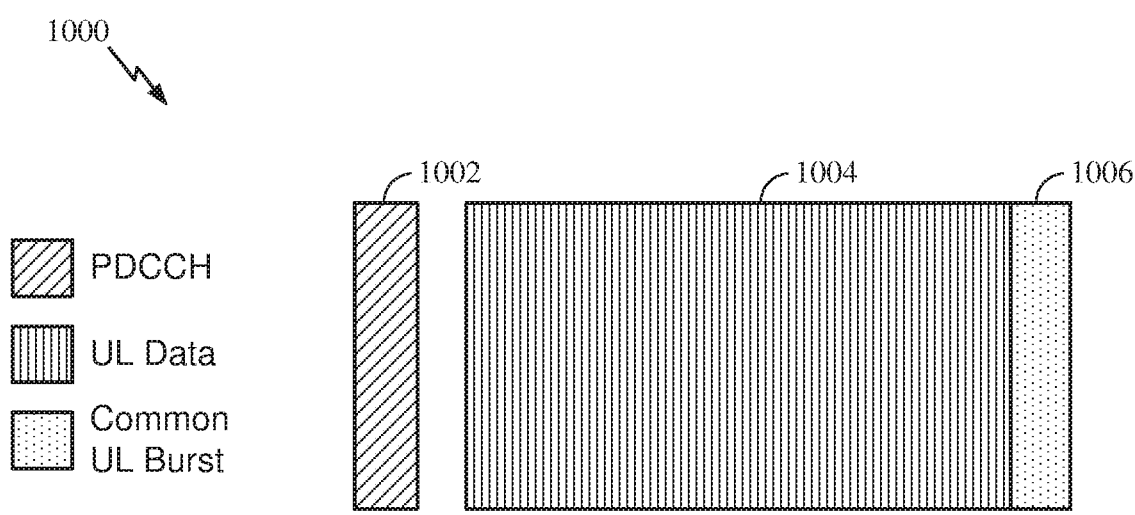
FIG. 10 illustrates an example of an uplink-centric subframe, in accordance with certain aspects of the present disclosure.

FIG. 10 is a diagram 1000 showing an example of an uplink-centric subframe, which may be used by one or more devices (e.g., BS 110 and/or UE 120) to communicate in the wireless network 100 depicted in FIG. 1. The UL-centric subframe may include a control portion 1002. The control portion 1002 may exist in the initial or beginning portion of the UL-centric subframe. The control portion 1002 in FIG. 10 may be similar to the control portion described above with reference to FIG. 9. The UL-centric subframe may also include an UL data portion 1004. The UL data portion 1004 may sometimes be referred to as the payload of the UL-centric subframe. The UL portion may refer to the communication resources utilized to communicate UL data from the subordinate entity (e.g., UE) to the scheduling entity (e.g., UE or BS). In some configurations, the control portion 1002 may be a physical DL control channel (PDCCH).

As illustrated in FIG. 10, the end of the control portion 1002 may be separated in time from the beginning of the UL data portion 1004. This time separation may sometimes be referred to as a gap, guard period, guard interval, and/or various other suitable terms. This separation provides time for the switch-over from DL communication (e.g., reception operation by the scheduling entity) to UL communication (e.g., transmission by the scheduling entity). The UL-centric subframe may also include a common UL portion 1006. The common UL portion 1006 in FIG. 10 may be similar to the common UL portion 906 described above with reference to FIG. 9. The common UL portion 1006 may additional or alternative include information pertaining to channel quality indicator (CQI), sounding reference signals (SRSs), and various other suitable types of information. The foregoing is merely one example of an UL-centric subframe and alternative structures having similar features may exist without necessarily deviating from the aspects described herein.

In some circumstances, two or more subordinate entities (e.g., UEs) may communicate with each other using sidelink signals. Applications of such sidelink communications may include public safety, proximity services, UE-to-network relaying, vehicle-to-vehicle (V2V) communications, Internet of Everything (IoE) communications, Internet of Things (IoT) communications, mission-critical mesh, and/or various other suitable applications. Generally, a sidelink signal may refer to a signal communicated from one subordinate entity (e.g., UE1) to another subordinate entity (e.g., UE2) without relaying that communication through the scheduling entity (e.g., UE or BS), even though the scheduling entity may be utilized for scheduling and/or control purposes. In some examples, the sidelink signals may be communicated using a licensed spectrum (unlike wireless local area networks, which typically use an unlicensed spectrum).

A UE may operate in various radio resource configurations, including a configuration associated with transmitting pilots using a dedicated set of resources (e.g., a radio resource control (RRC) dedicated state, etc.) or a configuration associated with transmitting pilots using a common set of resources (e.g., an RRC common state, etc.). When operating in the RRC dedicated state, the UE may select a dedicated set of resources for transmitting a pilot signal to a network. When operating in the RRC common state, the UE may select a common set of resources for transmitting a pilot signal to the network. In either case, a pilot signal transmitted by the UE may be received by one or more network access devices, such as an AN, or a DU, or portions thereof. Each receiving network access device may be configured to receive and measure pilot signals transmitted on the common set of resources, and also receive and measure pilot signals transmitted on dedicated sets of resources allocated to the UEs for which the network access device is a member of a monitoring set of network access devices for the UE. One or more of the receiving network access devices, or a CU to which receiving network access device(s) transmit the measurements of the pilot signals, may use the measurements to identify serving cells for the UEs, or to initiate a change of serving cell for one or more of the UEs.

Example Polar Codes

As noted above, polar codes may be used to encode a number of information bits (including CRC if one is attached), K, for transmission. Polar codes are the first provably capacity-achieving coding scheme with almost linear (in block length) encoding and decoding complexity. Polar codes are widely considered as a candidate for error-correction in the next-generation wireless systems. Polar codes have many desirable properties such as deterministic construction (e.g., based on a fast Hadamard transform), very low and predictable error floors, and simple successive-cancellation (SC) based decoding.

Polar codes are linear block codes of length $N=2^n$ where their generator matrix is constructed using the $n^{th}$ Kronecker power of the matrix $$G = \begin{pmatrix} 1 & 0 \\ 1 & 1 \end{pmatrix},$$

denoted by $G^n$. For example, Equation (1) shows the resulting generator matrix for n=3.

$$G^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \quad \text{Eq. 1}$$

According to certain aspects, a codeword may be generated (e.g., by a BS) by using the generator matrix to encode a number of input bits (e.g., information bits). For example, given a number of input bits $u=(u_0, u_1, \ldots, u_{N-1})$, a resulting codework vector $x=(x_0, x_1, \ldots, x_{N-1})$ may be generated by encoding the input bits using the generator matrix G. This resulting codeword may then be rate matched (e.g., using techniques described herein) and transmitted by a base station over a wireless medium and received by a UE.

When the received vectors are decoded (e.g., by the UE) using a Successive Cancellation (SC) decoder (e.g., decoder 816 in FIG. 8), every estimated bit, $\hat{u}_i$, has a predetermined error probability given that bits $u_0^{i-1}$ were correctly decoded, that tends towards either 0 or 0.5. Moreover, the proportion of estimated bits with a low error probability tends towards the capacity of the underlying channel. Polar codes exploit a phenomenon called channel polarization by using the most reliable K bits to transmit information, while setting, or freezing, the remaining (N−K) bits to a predetermined value, such as 0, for example as explained below.

For very large N, polar codes transform the channel into N parallel "virtual" channels for the N information bits. If C is the capacity of the channel, then there are almost N*C bit-channels that are completely noise free and there are N*(1−C) bit-channels that are completely noisy. The basic polar coding scheme then involves freezing (i.e., not transmitting) the information bits to be sent along the completely noisy channel and sending information only along the perfect channels. For short-to-medium N, this polarization may not be complete in the sense there could be several channels which are neither completely useless nor completely noise free (i.e., channels that are in transition). Depending on the rate of transmission, these channels in the transition are either frozen or they are used for transmission.

Example Rate-Matching Scheme for Control Channel Using Polar Codes

Aspects of the present disclosure relate to a rate-matching scheme for control channels using polar codes. Rate matching is a process whereby the number of bits to be transmitted is matched to the available bandwidth, for example, the number of bits allowed to be transmitted. In certain instances the amount of data to be transmitted is less than the available bandwidth, and in such instances, all the data to be transmitted in addition to one or more copies of the data (a technique called repetition). In other instances the amount of data to be transmitted exceeds the available bandwidth, and in such instances a certain portion of the data to be transmitted may be omitted from the transmission (a technique called puncturing)

Figure 11:
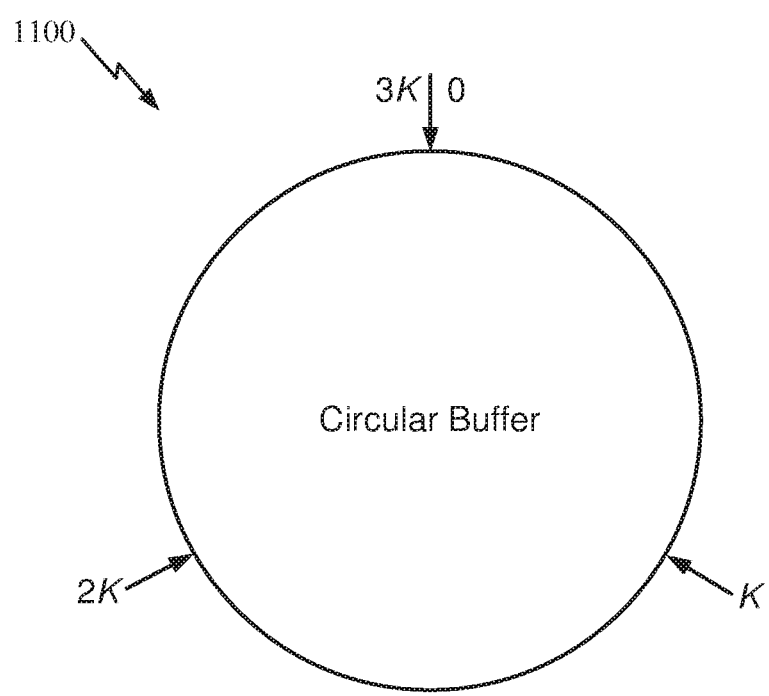
FIG. 11 illustrates an example of a circular buffer, in accordance with certain aspects of the present disclosure.

In LTE, tail biting convolutional codes (TBCCs) of rate 1/3 are used for rate matching control channels, which is typically performed using a circular buffer, such as circular buffer 1100 shown in FIG. 11. For example, after encoding a stream of bits, the resultant encoded bits from the three polynomials are put into the circular buffer one by one. For example, with reference to FIG. 11, code bits from a first polynomial are placed in the circular buffer in the range of [0, K). Further, code bits from a second polynomial are placed in the circular buffer in the range of [K, 2K), and code bits from a third polynomial are placed in the circular buffer in the range of [2K, 3K).

Once the coded bits are placed in the circular buffer, rate matching may be performed. For example, assuming a number of coded bits for transmission of 'E', if E=3K, then no repetition of puncturing (i.e., rate matching) is performed. However, if E>3K, then repetition may be performed clockwise or counter-clockwise from 3K around the circular buffer. Additionally, if E<3K, then puncturing may be performed counter-clockwise from 3K around the circular buffer.

In NR, polar codes may be used to encode a stream of bits for transmission. However, in some cases, using the rate matching scheme described above (e.g., for TBCC codes) may lead to performance loss when used with polar codes, for example, when the size of the circular buffer is not a power of 2 (e.g., the block length constraint of polar codes). Thus, aspects of the present disclosure propose an efficient rate-matching scheme for control channels using polar codes.

Figure 12:
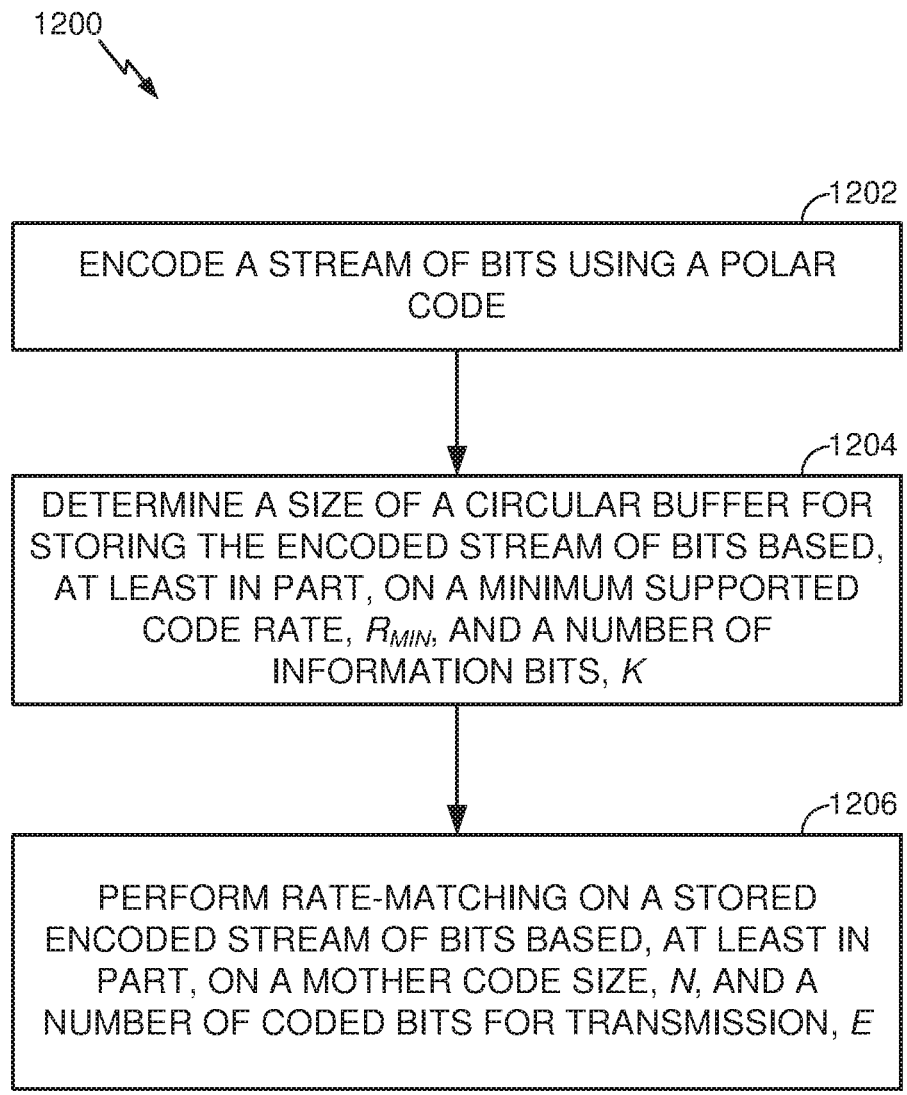
FIG. 12 is a flow diagram illustrating example operations for wireless communications in a network, in accordance with certain aspects of the present disclosure.

FIG. 12 illustrates example operations 1200 for wireless communications, for example, for rate-mating of a control channel using polar codes. Operations 1200 may be performed by a wireless communications device, such as a base station (BS 110), user equipment 120, and/or other wireless communications devices.

Operations 1200 begin at 1202 by encoding a stream of hits using a polar code. Operations 1200 then proceed to 1204, where the wireless communications device determines a size of a circular buffer for storing the encoded stream of bits based, at least in part, on a minimum supported code rate, $R_{min}$, and a number of information bits, K. Operations 1200 then proceed to 1206, where the wireless communications device performs rate-matching on a stored encoded stream of bits based, at least in part, on a mother code size, N, of the stored encoded stream of bits and a number of coded bits for transmission, E. Additionally, while not illustrated, operations 1200 may also include transmitting the rate-matched encoded hits, for example, using one or more antennas.

Figure 13:
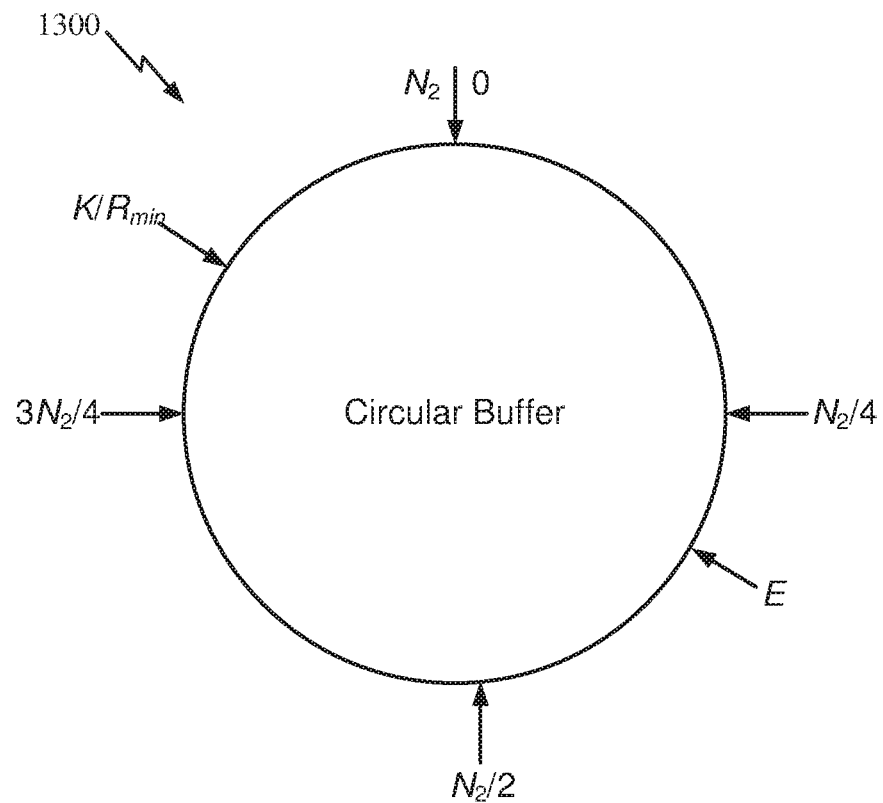
FIG. 13 illustrates an example of a circular buffer and rate-matching using polar codes, in accordance with certain aspects of the present disclosure.

As noted, the wireless communications device may first encode a stream of bits using a polar code. The wireless communications device may then store the encoded bits in a circular buffer, for example, as illustrated in FIG. 13. The size of the circular buffer (which is equal to the mother code size, N) may be determined as $N_2$ or $N_2/2$. $N_2$ is the minimum power of 2 (e.g., in $2^x$), which is not less than the number of information bits (including CRC if one is attached), K, divided by the minimum supported code rate, $R_{min}$ (e.g., 1/6, 1/8, etc.). For example, assume that the K=32 and R=1/6, $N_2$ is equal to 256 (i.e., $2^8$) because 256 represents the minimum power of 2 that is not less than 32*6=192. In other words, $N_2$ does not equal 128 (e.g., $2^7$) as 128 is less than 192 and $N_2$ does not equal 512 as 512 is not the minimum power of two before 192.

The wireless communications device may then determine a parameter, $N_M$, where $N_M$ is the minimum power of 2 which is not less than the number of coded bits for transmission, E. Further, a parameter $N_1$ may be determined according to:

$$N_1 = \begin{cases} \frac{N_M}{2} & \text{if } E \leq \beta N_M \\ N_M & \text{otherwise} \end{cases}$$

In the example above, $\beta$ is a real value in the range of [1, 2]. For example, $\beta$ may be equal to 1.125 or 9/8 in some examples.

The wireless communications device may then determine a mother code size, N, where N is an integer whose value is the minimum between $N_1$ and $N_2$. For example, the wireless communications device may determine N according to $N=\min(N_1, N_2)$.

According to certain aspects, the wireless communications device may then perform rate-matching on the stored encoded stream of bits in the circular buffer. As noted above, rate-matching may involve puncturing certain bits of the stored encoded bits or repeating certain bits of the stored encoded bits. Whether puncturing or repeating will be use may be determined based on a number of coded bits for transmission, E, and the mother code size, N. If E>N, E-N of the stored encoded bits are repeated based on Polar code (N, K) starting at the starting point of the circular buffer in, for example, a counter-clockwise fashion (i.e., starting at the starting point and repeating stored encoded bits counter-clockwise around the circular buffer). Additionally, if E<N at low rate, N-E of the stored encoded bits are punctured based on Polar code (N, K) starting at the starting point of the circular buffer in a counter-clockwise fashion (i.e., starting at the starting point and puncturing stored coded bits counter-clockwise around the circular buffer). If E<N at high rate, N-E of the stored encoded bits are shortened based on Polar code (N, K) starting at the ending point of the circular buffer in a counter-clockwise fashion (i.e., starting at the ending point and shortened stored encoded bits counter-clockwise around the circular buffer).

According to certain aspects, the puncturing, shortening and repeating of bits may be performed according to a defined pattern. For example, puncturing of bits, the defined pattern may be $[1_E \; 0_{N-E}]$. According to certain aspects, the wireless communications device may generate a vector of E ones followed by N-E zeros according to the pattern. The wireless communications device may then puncture bits in locations of the N-E zeros in the circular buffer starting from the location N and running counter-clockwise. In some cases, the wireless communications device may puncture bits in locations the circular buffer according to a bit-reversal of the generated vector, for example, starting at the location N and running counter-clockwise.

According to certain aspects, for repetition of bits, the defined pattern may be $[1_{E-N} \; 0_{2N-E}]$. The wireless communications device may generate a vector of E-N ones followed by 2N-E zeros according to the pattern. The wireless communications device may then repeat bits in locations of the E-N ones in the circular buffer, for example, starting the location N and running counter-clockwise. In some cases, the wireless communications device may repeat bits in locations of the circular buffer according to a bit-reversal of the vector, for example, starting the location N and running counter-clockwise.

Figure 14:
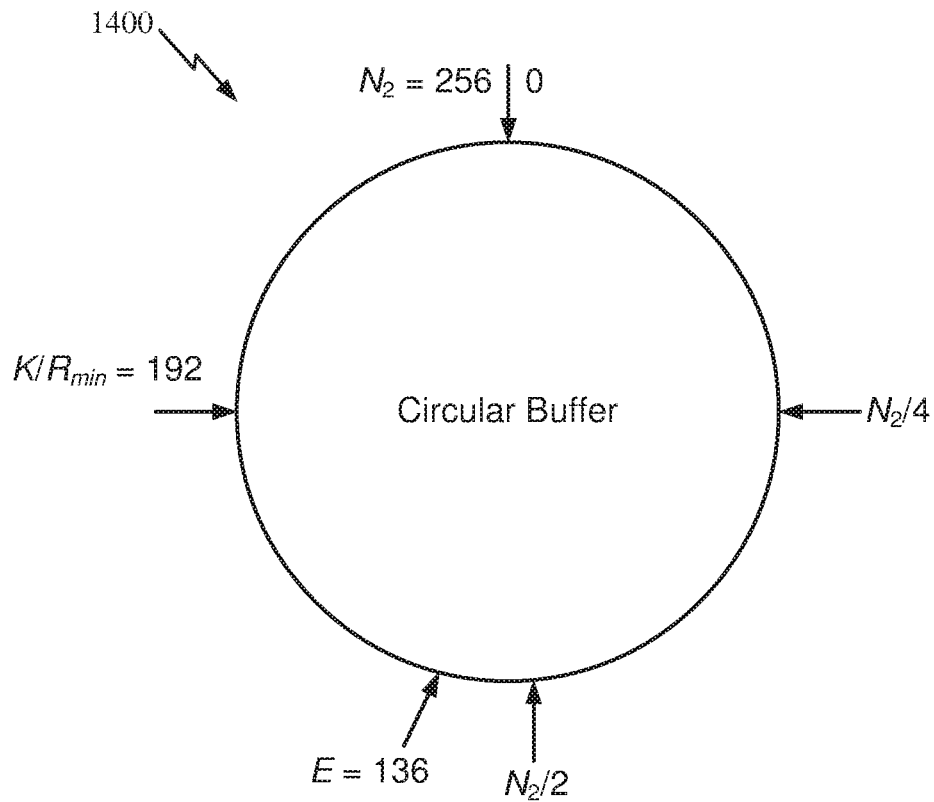
FIG. 14 illustrates an example of determining the size of a circular buffer and puncturing of bits in the circular buffer.

FIG. 14 illustrates an example of determining the size of a circular buffer and puncturing of bits in the circular buffer. The example in FIG. 14 assumes that a number of information bits (including CRC if one is attached) K=32, a minimum supported code rate of $R_{min}$=1/6, a number of coded bits for transmission E=136, and $\beta$=9/8. According to certain aspects, $N_2$ may be determined by the wireless communications device to be 256, which represents the lowest power of 2 (e.g., in $2^x$) that is not less than 32/(1/6) (i.e., $K/R_{min}$). $N_M$ is determined by wireless communications device to be 256, which represents the lowest power of 2 that is not less than E. Further, the wireless communications device determines the value of $N_1$=128, according to $$N_1 = \begin{cases} \frac{N_M}{2} & \text{if } E \leq \beta N_M \\ N_M & \text{otherwise} \end{cases}$$

The wireless communications device may then determine the mother code size $N=\min(N_1, N_2)=128$.

In the example of FIG. 14, the wireless communications device determines N=128, or 256/2 (i.e., $N_M/2$). The wireless communications device may then determine wither repetition or puncturing will be performed, for example, based on mother code size N and the number of coded bits for transmission, E. For example, in the example illustrated in FIG. 14, the wireless communications device will determine that 8 coded bits in the circular buffer will need to be punctured based on the Polar code (128, 32), for example, since E>N (i.e., 136>128). According to aspects, the wireless communications device will repeat these 8 coded bits according to the patterns described above starting at the starting point of the circular buffer and running counter-clockwise.

Figure 15:
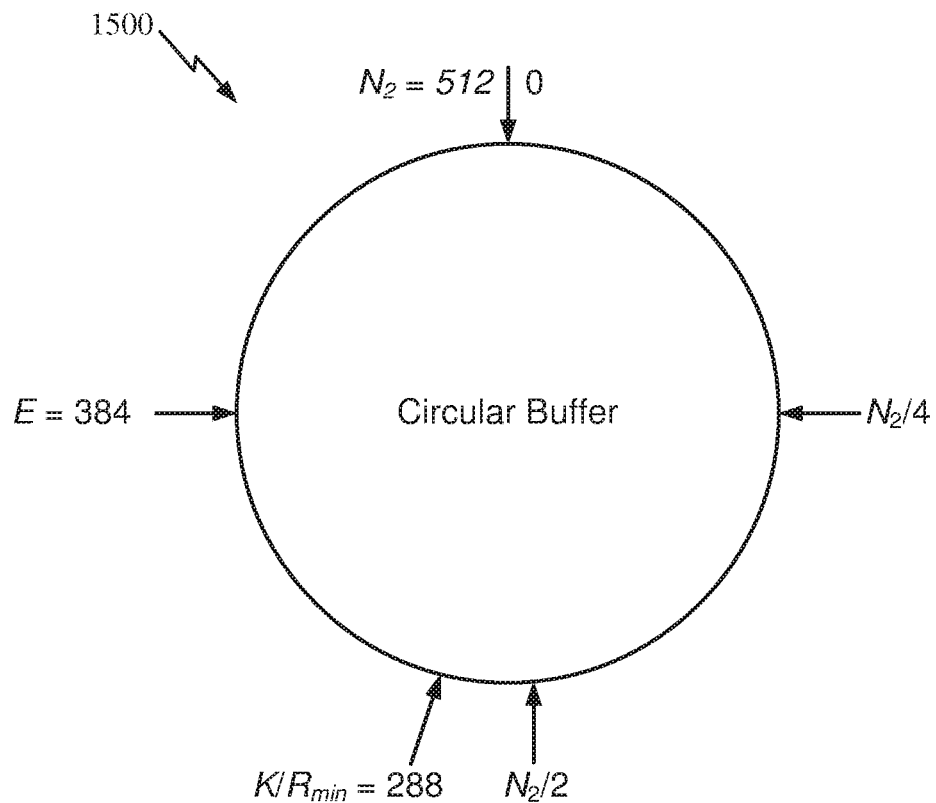
FIG. 15 illustrates an example of determining the size of a circular buffer and repetition of bits in the circular buffer.

FIG. 15 illustrates an example of determining the size of a circular buffer and repetition of bits in the circular buffer. The example in FIG. 15 assumes that a number of information bits (including CRC if one is attached) K=48, a minimum supported code rate of $R_{min}$=1/6, a number of coded bits for transmission E=384, a $\beta$=1.125. According to certain aspects, $N_2$ may be determined by the wireless communications device to be 512, which represents the lowest power of 2 (e.g., in $2^x$) that is not less than 48/(1/6) (i.e., $K/R_{min}$). $N_M$ is determined by wireless communications device to be 512, which represents the lowest power of 2 that is not less than E. Further, the wireless communications device determines the value of $N_1$=512 according to:

$$N_1 = \begin{cases} \dfrac{N_M}{2} & \text{if } E \le \beta N_M \\ N_M & \text{otherwise} \end{cases}.$$

The wireless communications device may then determine the mother code size N=min(N$_1$, N$_2$)=512.

In the example of FIG. 15, the wireless communications device determines N=512, or 512/1 (i.e., N$_M$). The wireless communications device may then determine wither repetition or puncturing will be performed, for example, based on the mother code size, N, and the number of coded bits for transmission, E. For example, in the example illustrated in FIG. 15, the wireless communications device will determine that 128 coded bits in the circular buffer will need to be punctured based on the Polar code (512, 48), for example, since E<N (i.e., 384<512). According to aspects, the wireless communications device will puncture these 128 coded bits according to the patterns described above starting at the location 0 in the circular buffer and running counter-clockwise.

According to aspects, the rate-matching scheme described above works for all combinations of the control information size and allocated block size. Additionally, there is a good trade-off between decoding complexity and performance. Further this rate-matching scheme guarantees comparable performance between a minimum supported coding rate, and a power of 2 mother code size, N. Moreover, the puncturing and repetition patterns presented herein are efficient and reduce performance loss.

The methods disclosed herein comprise one or more steps or actions for achieving the described method. The method steps and actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

In some cases, rather than actually transmitting a frame, a device may have an interface to output a frame for transmission. For example, a processor may output a frame, via a bus interface, to an RF front end for transmission. Similarly, rather than actually receiving a frame, a device may have an interface to obtain a frame received from another device. For example, a processor may obtain (or receive) a frame, via a bus interface, from an RF front end for transmission.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for transmitting, means for receiving, means for determining, means for performing (e.g., rate-matching), means for encoding, means for, puncturing, means for repeating, and/or means for generating may comprise one or more processors or antennas at the BS 110 or UE 120, such as the transmit processor 220, controller/processor 240, receive processor 238, or antennas 234 at the BS 110 and/or the transmit processor 264, controller/processor 280, receive processor 258, or antennas 252 at the UE 120.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer-readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A method of wireless communications by a first wireless communication device, comprising:
encoding a stream of bits using a polar code;
storing the encoded stream of bits in a circular buffer, wherein a size of the circular buffer is based on a minimum supported code rate ($R_{min}$) and a number of information bits (K);
performing rate-matching on the encoded stream of bits stored in the circular buffer based on a code size (N) and a number of coded bits for transmission (E); and
transmitting the rate-matched encoded stream of bits in a wireless network to a receiving device.

2. The method of claim 1, wherein performing rate-matching on the stored encoded stream of bits comprises puncturing a first number of stored encoded bits if E is less than N.

3. The method of claim 2, wherein the puncturing is performed according to a defined pattern starting at a location of N in the circular buffer and proceeding in a counter-clockwise fashion.

4. The method of claim 3, wherein puncturing according to the defined pattern comprises:
generating a vector of E ones followed by N-E zeros; and
performing one of:
puncturing bits in a location of the N-E zeros in the circular buffer; or
puncturing bits in locations in the circular buffer according to a bit-reversal of the vector.

5. The method of claim 1, wherein performing rate-matching on the stored encoded stream of bits comprises repeating a second number of stored encoded bits if E is greater than N.

6. The method of claim 5, wherein the repeating is performed according to a defined pattern starting at a location of N in the circular buffer and proceeding in a counter-clockwise fashion.

7. The method of claim 6, wherein repeating according to the defined pattern comprises:
generating a vector of E-N ones followed by 2N-E zeros; and
performing one of:
repeating bits in a location of the E-N ones in the circular buffer; or
repeating bits in locations of the circular buffer according to a bit-reversal of the vector.

8. The method of claim 1, wherein the minimum supported code rate is one of 1/6 or 1/8.

9. The method of claim 1, further comprising:
determining a parameter ($N_M$), where $N_M$ is the minimum power of 2 which is not less than E; and
determining another parameter ($N_1$), according to:

$$N_1 = \begin{cases} \frac{N_M}{2} & \text{if } E \leq \beta N_M \\ N_M & \text{otherwise} \end{cases}$$

wherein β is a real value in the range of [1, 2].

10. The method of claim 9, wherein $N=\min(N_1, N_2)$.

11. The method of claim 9, wherein β is equal to 1.125.

12. A non-transitory computer-readable medium, comprising:
instructions that, when executed by a processor of a first wireless communication device, cause the first wireless communication device to:
encode a stream of bits using a polar code;
store the encoded stream of bits in a circular buffer, wherein a size of the circular buffer is based on a minimum supported code rate ($R_{min}$) and a number of information bits (K);
perform rate-matching on the encoded stream of bits stored in the circular buffer based on a code size (N) and a number of coded bits for transmission (E); and
transmit the rate-matched encoded stream of bits in a wireless network to a receiving device.

13. The non-transitory computer-readable medium of claim 12, wherein, in order to cause the first wireless communication device to perform rate-matching on the stored encoded stream of bits, the instructions cause the first wireless communication device to puncture a first number of stored encoded bits if E is less than N.

14. The non-transitory computer-readable medium of claim 13, wherein the instructions cause the first wireless communication device to puncture the first number of stored encoded bits according to a defined pattern starting at a location of N in the circular buffer and proceeding in a counter-clockwise fashion.

15. The non-transitory computer-readable medium of claim 14, wherein, in order to cause the first wireless communication device to puncture the first number of stored encoded bits according to the defined pattern, the instructions cause the first wireless communication device to:
generate a vector of E ones followed by N-E zeros; and
one of:
puncture bits in a location of the N-E zeros in the circular buffer; or
puncture bits in locations in the circular buffer according to a bit-reversal of the vector.

16. The non-transitory computer-readable medium of claim 12, wherein, in order to cause the first wireless communication device to perform rate-matching on the stored encoded stream of bits, the instructions cause the first wireless communication device to repeat a second number of stored encoded bits if E is greater than N.

17. The non-transitory computer-readable medium of claim 16, wherein the instructions cause the first wireless communication device to repeat the second number of stored encoded bits according to a defined pattern starting at a location of N in the circular buffer and proceeding in a counter-clockwise fashion.

18. The non-transitory computer-readable medium of claim 17, wherein, in order to cause the first wireless communication device to repeat the second number of stored encoded bits according to the defined pattern, the instructions cause the first wireless communication device to:
generate a vector of E-N ones followed by 2N-E zeros; and
one of:
repeat bits in a location of the E-N ones in the circular buffer; or
repeat bits in locations of the circular buffer according to a bit-reversal of the vector.

19. The non-transitory computer-readable medium of claim 12, wherein the minimum supported code rate is one of 1/6 or 1/8.

20. The non-transitory computer-readable medium of claim 12, wherein the instructions further cause the first wireless communication device to:
determine a parameter ($N_M$), where $N_M$ is the minimum power of 2 which is not less than E; and
determine another parameter ($N_1$), according to:

$$N_1 = \begin{cases} \frac{N_M}{2} & \text{if } E \leq \beta N_M \\ N_M & \text{otherwise} \end{cases}$$

wherein β is a real value in the range of [1, 2].

21. The non-transitory computer-readable medium of claim 20, wherein $N=\min(N_1, N_2)$.

22. The non-transitory computer-readable medium of claim 20, wherein β is equal to 1.125.

23. A first wireless communication device, comprising:
a memory comprising executable instructions;
a processor in data communication with the memory and configured to execute the executable instructions and cause the first wireless communication device to:
encode a stream of bits using a polar code;
store the encoded stream of bits in a circular buffer, wherein a size of the circular buffer is based on a minimum supported code rate ($R_{min}$) and a number of information bits (K);
perform rate-matching on the encoded stream of bits stored in the circular buffer based on a code size (N) and a number of coded bits for transmission (E); and
transmit the rate-matched encoded stream of bits in a wireless network to a receiving device.

24. The first wireless communication device of claim 23, wherein in order to perform rate-matching on the stored encoded stream of bits, the processor is further configured to cause the first wireless communication device to puncture a first number of stored encoded bits if E is less than N.

25. The first wireless communication device of claim 24, wherein the processor is further configured to cause the first wireless communication device to puncture the first number of stored encoded bits according to a defined pattern starting at a location of N in the circular buffer and proceeding in a counter-clockwise fashion.

26. The first wireless communication device of claim 25, wherein in order to puncture according to the defined pattern, the processor is further configured to cause the first wireless communication device to:
generate a vector of E ones followed by N-E zeros; and
perform one of:
puncture bits in a location of the N-E zeros in the circular buffer; or
puncture bits in locations in the circular buffer according to a bit-reversal of the vector.

27. The first wireless communication device of claim 23, wherein in order to perform rate-matching on the stored encoded stream of bits, the processor is further configured to cause the first wireless communication device to repeat a second number of stored encoded bits if E is greater than N.

28. The first wireless communication device of claim 27, wherein the processor is further configured to cause the first wireless communication device to repeat the second number of stored encoded bits according to a defined pattern starting at a location of the mother code size, N, in the circular buffer and proceeding in a counter-clockwise fashion.

29. The first wireless communication device of claim 28, wherein in order to repeat according to the defined pattern, the processor is further configured to cause the first wireless communication device to:
generate a vector of E-N ones followed by 2N-E zeros; and
perform one of:
repeat bits in a location of the E-N ones in the circular buffer; or
repeat bits in locations of the circular buffer according to a bit-reversal of the vector.

30. The first wireless communication device of claim 23, wherein the minimum supported code rate is one of 1/6 or 1/8.

31. The first wireless communication device of claim 23, wherein the processor is further configured to cause the first wireless communication device to:
determine a parameter ($N_M$), where $N_M$ is the minimum power of 2 which is not less than E; and
determine another parameter ($N_1$), according to:

$$N_1 = \begin{cases} \dfrac{N_M}{2} & \text{if } E \leq \beta N_M \\ N_M & \text{otherwise} \end{cases}$$

wherein β is a real value in the range of [1, 2].

32. The first wireless communication device of claim 31, wherein $N=\min(N_1, N_2)$.

33. The first wireless communication device of claim 31, wherein β is equal to 1.125.

34. A first wireless communication device, comprising:
means for encoding a stream of bits using a polar code;
means for storing the encoded stream of bits in a circular buffer, wherein a size of the circular buffer is based on a minimum supported code rate ($R_{min}$) and a number of information bits (K);
means for performing rate-matching on the encoded stream of bits stored in the circular buffer based on a code size (N) and a number of coded bits for transmission (E); and
means for transmitting the rate-matched encoded stream of bits in a wireless network to a receiving device.

35. The first wireless communication device of claim 34, wherein the means for performing rate-matching on the stored encoded stream of bits comprise means for puncturing a first number of stored encoded bits if E is less than N.

36. The first wireless communication device of claim 35, wherein the means for puncturing the first number of stored encoded bits comprise means for puncturing the first number of stored encoded bits according to a defined pattern starting at a location of N in the circular buffer and proceeding in a counter-clockwise fashion.

37. The first wireless communication device of claim 36, wherein means for puncturing the first number of stored encoded bit according to the defined pattern comprise:
means for generating a vector of E ones followed by N-E zeros; and
one of:
means for puncturing bits in a location of the N-E zeros in the circular buffer; or
means for puncturing bits in locations in the circular buffer according to a bit-reversal of the vector.

38. The first wireless communication device of claim 34, wherein the means for performing rate-matching on the stored encoded stream of bits comprise means for repeating a second number of stored encoded bits if E is greater than N.

39. The first wireless communication device of claim 38, wherein the means for repeating the second number of stored encoded bits comprise means for repeating the second number of stored encoded bits according to a defined pattern starting at a location of N in the circular buffer and proceeding in a counter-clockwise fashion.

40. The first wireless communication device of claim 39, wherein the means for repeating the second number of stored encoded bits according to the defined pattern comprise:
means for generating a vector of E-N ones followed by 2N-E zeros; and
one of:
means for repeating bits in a location of the E-N ones in the circular buffer; or
means for repeating bits in locations of the circular buffer according to a bit-reversal of the vector.

41. The first wireless communication device of claim 34, wherein the minimum supported code rate is one of 1/6 or 1/8.

42. The first wireless communication device of claim 34, further comprising:
means for determining a parameter ($N_M$), where Nu is the minimum power of 2 which is not less than E; and
means for determining another parameter ($N_1$), according to:

$$N_1 = \begin{cases} \dfrac{N_M}{2} & \text{if } E \leq \beta N_M \\ N_M & \text{otherwise} \end{cases}$$

wherein β is a real value in the range of [1, 2].

43. The first wireless communication device of claim 42, wherein $N=\min(N_1, N_2)$.

44. The first wireless communication device of claim 42 wherein β is equal to 1.125.

* * * * *